United States Patent [19]
Nomura et al.

[11] Patent Number: 5,991,097
[45] Date of Patent: Nov. 23, 1999

[54] LENS BARREL HAVING A LINEAR GUIDE MECHANISM

[75] Inventors: Hiroshi Nomura; Kazuyoshi Azegami; Takamitsu Sasaki, all of Tokyo, Japan

[73] Assignee: Asahi Kogaku Kogko Kabushiki Kaisha, Tokyo, Japan

[21] Appl. No.: 09/037,506

[22] Filed: Mar. 10, 1998

Related U.S. Application Data

[62] Division of application No. 08/781,593, Jan. 9, 1997, Pat. No. 5,793,537.

[30] Foreign Application Priority Data

| Jan. 26, 1996 | [JP] | Japan | 8-12317 |
| Feb. 7, 1996 | [JP] | Japan | 8-21438 |
| Feb. 21, 1996 | [JP] | Japan | 8-34037 |
| Jul. 15, 1996 | [JP] | Japan | 8-184791 |

[51] Int. Cl.⁶ ................................................. G02B 15/14
[52] U.S. Cl. ................................................. 359/700
[58] Field of Search ........................... 359/699, 700, 359/701, 694, 704, 823

[56] References Cited

U.S. PATENT DOCUMENTS

| 3,817,601 | 6/1974 | Colaiace et al. | 359/700 |
| 4,171,880 | 10/1979 | Mori et al. | 359/706 |
| 4,944,030 | 7/1990 | Haraguchi et al. | 396/62 |
| 5,153,626 | 10/1992 | Yamamoto | 396/349 |
| 5,198,932 | 3/1993 | Takamura | 359/694 |
| 5,218,479 | 6/1993 | Chiou et al. | 359/700 |
| 5,231,449 | 7/1993 | Nomura | 396/542 |
| 5,245,476 | 9/1993 | Shono | 359/699 |
| 5,329,329 | 7/1994 | Fukushima et al. | 359/691 |
| 5,349,475 | 9/1994 | Nomura et al. | 359/694 |
| 5,394,210 | 2/1995 | Nomura et al. | 396/529 |
| 5,424,793 | 6/1995 | Fukushima et al. | 359/199 |
| 5,430,516 | 7/1995 | Uziie et al. | 396/529 |
| 5,467,227 | 11/1995 | Nomura | 359/694 |
| 5,652,922 | 7/1997 | Kohno | 396/72 |
| 5,721,645 | 2/1998 | Iwasaki et al. | 359/823 |

*Primary Examiner*—Georgia Epps
*Assistant Examiner*—Ricky Mack
*Attorney, Agent, or Firm*—Greenblum & Bernstein P.L.C.

[57] ABSTRACT

A lens barrel includes an outer barrel provided on an inner periphery with a first thread and at least one linear guide groove intersecting the first thread and extending in a direction of an optical axis of the lens barrel, a middle barrel provided on an outer periphery with a second thread meshing with the first thread, and an inner barrel positioned inside the middle barrel. The inner barrel is provided with at least one follower which engages with the at least one linear guide groove, so that the inner barrel is guided along the optical axis without rotating about the optical axis with respect to the outer barrel. The lens barrel is also provided with a recess formed at a front end of each of the at least one linear guide groove on the inner periphery of the outer barrel. The recess has a width dimension which enables rotational movement of the at least one follower into the at least one linear guide groove during initial meshing of the middle barrel with the outer barrel.

6 Claims, 31 Drawing Sheets

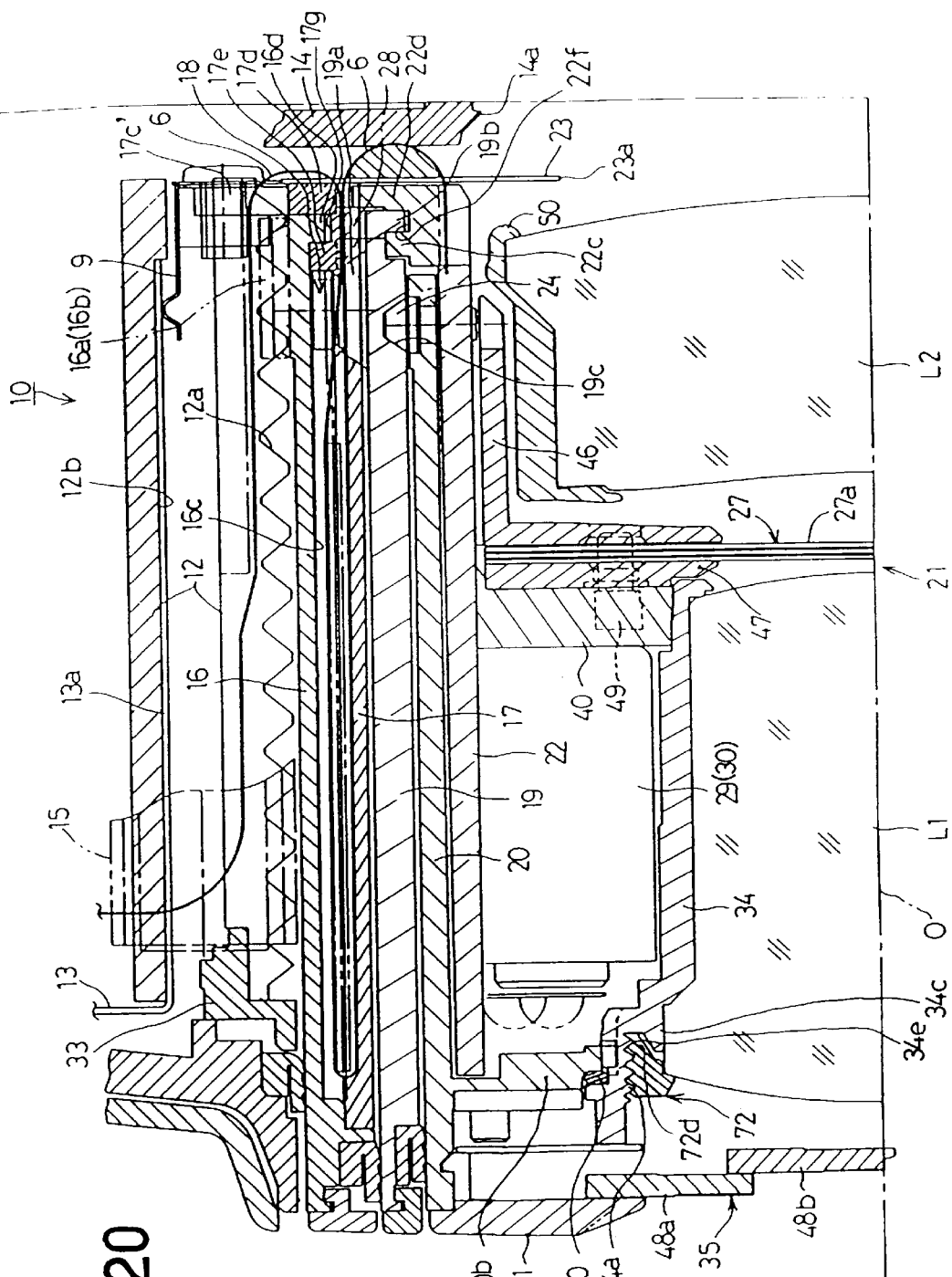

LENS BARREL HAVING A LINEAR GUIDE MECHANISM

This application is a division of Ser. No. 08/781,593 filed Jan 9, 1997, now U.S. Pat. No. 5,793,537.

BACKGROUND OF THE INVENTION

1. Field of the Invention

The present invention relates to a lens barrel having a linear guide mechanism provided in the lens barrel for guiding a linear moving barrel along an optical axis without the lens barrel rotating about the optical axis.

2. Description of the Related Art

A conventional lens-shutter type of zoom lens camera having a telescoping type of zoom lens barrel is widely known. In such a type of zoom lens camera, a zoom lens barrel unit is usually assembled separately from a main body (camera body) of the camera before being installed in a housing of the camera body. The housing of the camera body is usually provided on an inner peripheral surface thereof with a female helicoid and a plurality of linear guide grooves intersecting the female helicoid and extending in the optical axis direction. In the camera body having such a housing, the zoom lens barrel unit is usually installed using the following method. The zoom lens barrel unit is first inserted into the housing from a rear of the housing. Subsequently, the male helicoid, formed on an outer peripheral surface of the outermost barrel of the zoom lens barrel unit, is brought into mesh with the female helicoid which is formed on an inner periphery of the housing. Thereafter, a linear guide plate, provided with a plurality of radial follower projections, is secured to the rear end of the outermost barrel and the plurality of follower projections engage with the plurality of linear guide grooves of the housing.

According to such an installing method, it is necessary to carry out several processes to install the zoom lens barrel unit in the housing of the camera body. This complicated installation process is troublesome and increases installation time.

When a lens barrel is designed having a guide groove or a cam groove formed on an inner peripheral surface which engages with a follower projection provided on a predetermined member to guide the same along the groove, the width and depth of the groove are determined before the whole dimension of the lens barrel (thickness, diameter, etc.) is determined. Also, the width and depth of the groove need to be sufficient to maintain the mechanical strength of the lens barrel. Therefore, in general, such a lens barrel having a guide or cam groove tends to be designed as a member which is too thick and too large.

SUMMARY OF THE INVENTION

An object of the present invention is to provide a lens barrel having a linear guide mechanism for guiding a linear moving barrel along an optical axis, which is space-efficient and simplifies the process necessary for installing the zoom lens barrel unit in the housing of the camera.

Another object of the present invention is to provide a lens barrel having a linear guide mechanism for guiding a linear moving barrel along an optical axis, which makes it possible to realize a small-sized lens barrel, while maintaining a sufficient mechanical strength of the lens barrel.

To achieve the former object mentioned above, according to an aspect of the present invention, there is provided a lens barrel which includes an outer barrel provided on an inner periphery thereof with a first thread and at least one linear guide groove intersecting the first thread and extending in a direction of an optical axis of the lens barrel, a middle barrel provided on an outer periphery thereof with a second thread meshing with the first thread, an inner barrel positioned inside the middle barrel and provided with at least one follower which engages with the at least one linear guide groove so that the inner barrel is guided along the optical axis without rotating about the optical axis with respect to the outer barrel, and a recess formed at a front end of each of the at least one linear guide grooves on the inner periphery of the outer barrel. The recess has a width dimension to enable rotational movement of the at least one follower into the at least one linear guide groove during initial meshing of the middle barrel with the outer barrel. With this structure, the recess is used not only for bringing the middle barrel into mesh with the outer barrel, but also for forming part of the linear guide groove. Thus, the recess is space-efficiently formed on a front part of the outer barrel, which contributes to the realization of a small and compact lens barrel.

Preferably, the lens barrel further includes an annular retaining member which engages with a front end of the outer barrel, after the middle barrel has been engaged with the outer barrel.

Preferably, the annular retaining member is provided with at least one engaging projection which engages with the at least one recess.

Preferably, the at least one engaging projection has a surface determining a front extremity of the at least one linear guide groove.

According to another aspect of the present invention, there is provided a lens barrel which includes an outer barrel provided on an inner periphery thereof with a first thread and a plurality of linear guide grooves each intersecting the first thread and extending in a direction of an optical axis of the lens barrel, a middle barrel provided on an outer periphery thereof with a second thread meshing with the first thread so that the middle barrel is movable along the optical axis while rotating about the optical axis with respect to the outer barrel, and an inner barrel positioned inside the middle barrel and moved together with the inner barrel along the optical axis. The inner barrel is provided at a rear end thereof with a plurality of followers which respectively engage with the plurality of linear guide grooves so that inner barrel is guided along the optical axis without rotating about the optical axis with respect to the outer barrel. The lens barrel also comprises a plurality of recesses each being formed at a front end of a corresponding one of the plurality of linear guide grooves on the inner periphery of the outer barrel and each having a width greater than the corresponding one of the plurality of linear guide grooves, and an annular retaining member for preventing the middle barrel from disengaging from the outer barrel. The annular retaining member is provided with a plurality of engaging projections each extending in the direction of the optical axis to engage with a corresponding one of the plurality of recesses, and the annular retaining member is secured to a front end of the outer barrel, after the middle barrel has been engaged with the outer barrel, with the plurality of engaging projections respectively engaged with the plurality of linear guide grooves.

According to yet another aspect of the present invention, there is provided a lens barrel which includes an outer barrel provided on an inner periphery thereof with a first thread, a middle barrel provided on an outer periphery with a second thread meshing with the first thread of the outer barrel, an inner barrel positioned inside the middle barrel and provided with at least one follower, an annular retaining member secured to a front end of the outer barrel for preventing the middle barrel from disengaging from the outer barrel, and at least one linear guide groove which extends in a direction of an optical axis of the lens barrel and with which the at least one follower engages. A part of the at least one linear guide groove is formed on the annular retaining member and a remaining part of the at least one linear guide groove is formed on an inner periphery of the outer barrel.

To achieve the latter object mentioned above, according to another aspect of the present invention, there is provided a lens barrel which includes a barrel provided on an inner periphery thereof with a linear guide groove extending in a direction of an optical axis of the lens barrel, and an annular member arranged concentrically with the barrel. The annular member is provided with a follower which engages with the linear guide groove so that the annular member is guided along the optical axis without rotating about the optical axis relative to the barrel. A part of an outer periphery of the barrel which is located adjacent to the linear guide groove is formed as a plane surface, and a distance between the plane surface and the optical axis is shorter than a distance between the optical axis and a part of the outer periphery of the barrel which is not formed as the plane surface.

Preferably, a bottom of the linear guide groove is formed as a plane bottom surface extending in the direction of the optical axis and perpendicular to a radial direction of the barrel, the plane surface being formed parallel to the plane bottom surface.

According to yet another aspect of the present invention, there is provided a lens barrel which includes an outer barrel provided on an inner periphery thereof with a first thread and a linear guide groove intersecting the first thread and extending in a direction of an optical axis of the lens barrel, a middle barrel provided on an outer periphery with a second thread meshing with the first thread, and an inner barrel positioned inside the middle barrel and provided with a follower which engages with the linear guide groove to be guided along the linear guide groove. The middle barrel is movable along the optical axis together with the inner barrel without varying a distance between the middle and the inner barrels while the middle barrel rotates about the optical axis relative to the inner barrel. The lens barrel also includes at least one projection formed at a bottom of the linear guide groove which engages with the second thread so as to function as a part of the first thread.

According to yet another aspect of the present invention, there is provided a lens barrel which includes a barrel provided on an inner periphery with a plurality of linear guide grooves each extending in a direction of an optical axis of the lens barrel, and an annular member arranged concentrically with the barrel. The annular member is provided with a plurality of followers which respectively engage with the plurality of linear guide grooves so that the annular member is guided along the optical axis without rotating about the optical axis relative to the barrel. A parts of the barrel where one of the plurality of linear guide grooves is formed has a thickness which is less than any other part of the barrel where the rest of the plurality of linear guide grooves are formed.

The present disclosure relates to subject matter contained in Japanese Patent Application Nos. 8-12317, filed on Jan. 26, 1996, 8-21438, filed on Feb. 7, 1996, 8-34027, filed on Feb. 21, 1996, and 8-184791, filed on Jul. 15, 1996, which are expressly incorporated herein by reference in their entireties.

BRIEF DESCRIPTION OF THE DRAWINGS

The invention will be described below in detail with reference to the accompanying drawings in which similar elements are indicated by similar reference numerals, and wherein:

FIG. 20 is a sectional view of an upper part of the zoom lens barrel in the housed state;

DESCRIPTION OF THE PREFERRED EMBODIMENT

Figure 22:
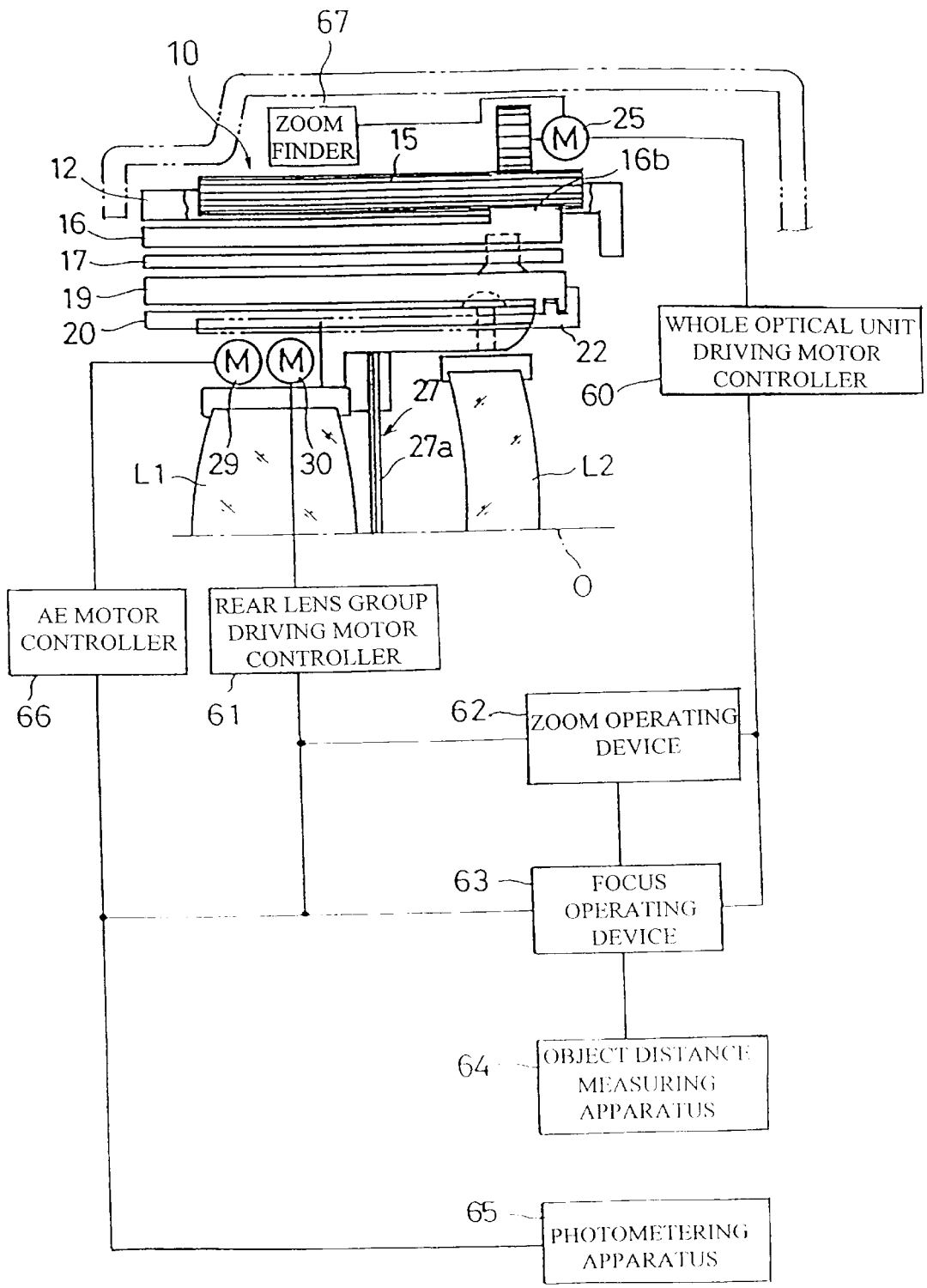
FIG. 22 is a block diagram of a controlling system for controlling an operation of the zoom lens barrel.

FIG. 22 is a schematic representation of various elements which comprise a preferred embodiment of a zoom lens camera to which the present invention is applied. A concept of the present zoom lens camera will now be described with reference to FIG. 22.

The zoom lens camera is provided with a zoom lens barrel (zoom lens) 10 of a three-stage delivery type (telescoping type) having three moving barrels, namely a first moving barrel 20, a second moving barrel 19 and a third moving barrel (rotational barrel) 16, which are concentrically arranged in this order from an optical axis 0. In the zoom lens barrel 10, two lens groups are provided as a photographic optical system, namely a front lens group L1 having positive power and a rear lens group L2 having negative power.

In the camera body, a whole optical unit driving motor controller 60, a rear lens group driving motor controller 61, a zoom operating device 62, a focus operating device 63, an object distance measuring apparatus 64, a photometering apparatus 65, and an AE (i.e., automatic exposure) motor controller 66, are provided. Although the specific focusing system of the object distance measuring apparatus 64, which is used to provide information regarding the object-to-camera distance, does not form part of the present invention, one such suitable system is disclosed in commonly assigned U.S. patent application Ser. No. 08/605,759, filed on Feb. 22, 1996, the entire disclosure of which is expressly incorporated by reference herein. Although the focusing systems disclosed in U.S. patent application Ser. No. 08/605,759 are of the so-called "passive" type, other known autofocus systems (e.g., active range finding systems such as those based on infrared light and triangulation) may be used. Similarly, a photometering system as disclosed in the above-noted U.S. patent application Ser. No. 08/605,759 could be implemented as photometering apparatus 65.

The zoom operating device 62 can be provided in the form of, for example, a manually-operable zoom operating lever (not shown) provided on the camera body or a pair of zoom buttons, e.g., a "wide" zoom button and a "tele" zoom button (not shown) provided on the camera body. When the zoom operation device 62 is operated, the whole optical unit driving motor controller 60 drives a whole optical unit driving motor 25 to move the front lens group L1 and the rear lens group L2, rearwardly or forwardly without regard to a focal length and a focal point thereof. In the following explanation, forward and rearward movements of the lens groups L1 and L2 by the whole optical unit driving motor controller 60 (the motor 25) are referred to as the movement toward "tele" and the movement toward "wide" respectively, since forward and rearward movements of the lens groups L1 and L2 occur when the zoom operating device 62 is operated to "tele" and "wide" positions.

The image magnification of the visual field of a zoom finder 67 provided in the camera body varies in accordance with the variation of the focal length through the operation of the zoom operating device 62. Therefore, the photographer can perceive the variation of the focal length by observing the variation of image magnification of the visual field of the finder. In addition, the focal length, as set by the operation of the zoom operating device 62, may be a value indicated by a value on an LCD (liquid crystal display) panel (not shown) or the like.

When the focus operating device 63 is operated, the whole optical unit driving motor controller 60 drives the whole optical unit driving motor 25. At the same time, the rear lens group driving motor controller 61 drives a rear lens group driving motor 30. The driving of the whole optical unit driving motor controller 60 and the rear lens group driving motor controller 61 causes the front and rear lens groups L1 and L2 to be moved to respective positions corresponding to a set focal length and a detected object distance, thereby the zoom lens is focused on the subject.

Specifically, the focus operating device 63 is provided with a release button (not shown) provided on an upper wall of the camera body. A photometering switch and a release switch (both not shown) are synchronized with the release button. When the release button is half-depressed (half step), the focus operating device 63 turns the photometering switch ON, and the object distance measuring and photometering commands are respectively input to the object distance measuring apparatus 64 and the photometering apparatus 65.

When the release button is fully depressed (full step), the focus operating device 63 turns the release switch ON, and according to the result of the object distance measurement and a set focal length, the whole optical unit driving motor 25 and the rear lens group driving motor 30 are driven, and the focusing operation is executed, in which the front lens group L1 and the rear lens group L2 move to the focusing position. Further, an AE motor 29 of an AF/AE (i.e., autofocus/autoexposure) shutter unit (electrical unit) 21 (FIG. 20) is driven via the AE motor controller 66 to actuate a shutter 27. During the shutter action, the AE motor controller 66 drives the AE motor 29 to open shutter blades 27a of the shutter 27 for a specified period of time according to the photometering information output from the photometering apparatus 65.

When the zoom operative device 62 is operated, the zoom operating device 62 drives the whole optical unit driving motor 25 to move the front and rear lens groups L1 and L2 together as a whole in the direction of the optical axis 0 (optical axis direction). The rear lens group driving motor 30 may also be driven via the rear lens group driving motor controller 61 to move the rear lens group L2 relative to the first lens group L1. However, this may not be performed under the conventional concept of zooming in which the focal length is varied sequentially without moving the position of the focal point.

When the zoom operating device 62 is operated, the following two modes are available:

1. A mode to move the front lens group L1 and the rear lens group L2 in the optical axis direction without varying the distance therebetween by driving only the whole optical unit driving motor 25; and 2. A mode to move the front lens group L1 and the rear lens group L2 in the optical axis direction while varying the distance therebetween by driving both the whole optical unit driving motor 25 and the rear lens group driving motor 30.

In mode 1, during a zooming operation an in-focus condition cannot be obtained at all times with respect to a subject located at a specific distance. However, in a lens-shutter type camera, since the image of the subject is not observed through the photographing optical system, but through the finder optical system provided separately from the photographing optical system, it is sufficient that the subject is only focused when the shutter is released. In mode 2, during a zooming operation the front lens group L1 and the rear lens group L2 are moved without regard to whether the focal point moves, and when the shutter is released, the focusing operation (focus adjusting operation) is carried out by moving both the whole optical unit driving motor 25 and the rear lens group driving motor 30.

When the focus operating device 63 is operated in at least one part of the focal length range set by the zoom operating device 62, the whole optical unit driving motor 25 and the rear lens group driving motor 30 are driven to bring the subject into focus. The amount of movement of each lens group L1 or L2 by the whole optical unit driving motor 25 and the rear lens group driving motor 30 is determined in accordance with subject distance information provided from the object distance measuring apparatus 64, and focal length information set by the zoom operating device 62. By moving both the whole optical unit driving motor 25 and the rear lens group driving motor 30 when the focus operating device 63 is operated, the position of the lens groups L1, L2 can be flexibly controlled in comparison to lens movements controlled by cam.

The zoom lens camera of this embodiment can also be controlled in a manner such that only the magnification of the zoom finder 67 and the focal length information are varied during an operation of the zoom operating device 62, without driving either the whole optical unit driving motor 25 or the rear lens group driving motor 30. Under this type of control, when the focus operating device 63 is operated, both the whole optical unit driving motor 25 and the rear lens group driving motor 30 are moved simultaneously according to the focal length information and the subject distance information obtained by the object distance measuring apparatus 64 to move the front lens group L1 and the rear lens group L2 to respective positions determined according to the focal length and the subject distance information.

An embodiment of the zoom lens barrel according to the above concept will now be described with reference to mainly FIGS. 21 and 22.

The overall structure of the zoom lens barrel 10 will firstly be described.

The zoom lens barrel 10 is provided with the first moving barrel 20, the second moving barrel 19, the third moving barrel 16, and a fixed lens barrel block 12. The third moving barrel 16 is engaged with a cylindrical portion 12p of the fixed lens barrel block 12, and moves in the optical axis direction upon being rotated. The third moving barrel 16 is provided on an inner periphery thereof with a linear guide barrel (cam ring or second barrel) 17, which is restricted in rotation. The linear guide barrel 17 and the third moving barrel 16 move together as a whole in the optical axis direction, with the third moving barrel 16 rotating relative to the linear guide barrel 17. The first moving barrel 20 moves in the optical axis direction with rotation thereof being restricted. The second moving barrel 19 moves in the optical axis direction, while rotating relative to the linear guide barrel 17 and the first moving barrel 20. The whole optical unit driving motor 25 is secured to the fixed lens barrel block 12. A shutter mounting stage 40 is secured to the first moving barrel 20. The AE motor 29 and the rear lens group driving motor 30 are mounted on the shutter mounting stage 40. The front lens group L1 and the rear lens group L2 are respectively supported by a lens supporting barrel (lens supporting annular member) 34 and a lens supporting barrel 50.

An O-ring 70, made of a rubber or the like, is positioned between an outer peripheral circumferential surface of the front end of the lens supporting barrel 34, and an inner peripheral circumferential surface of an inner flange portion 20b integrally formed in the front end of the first moving barrel 20 as shown in FIG. 20. The O-ring 70 prevents water from penetrating the zoom lens barrel 10 at the front end thereof between the first moving barrel 20 and the lens supporting barrel 34.

Figure 30:
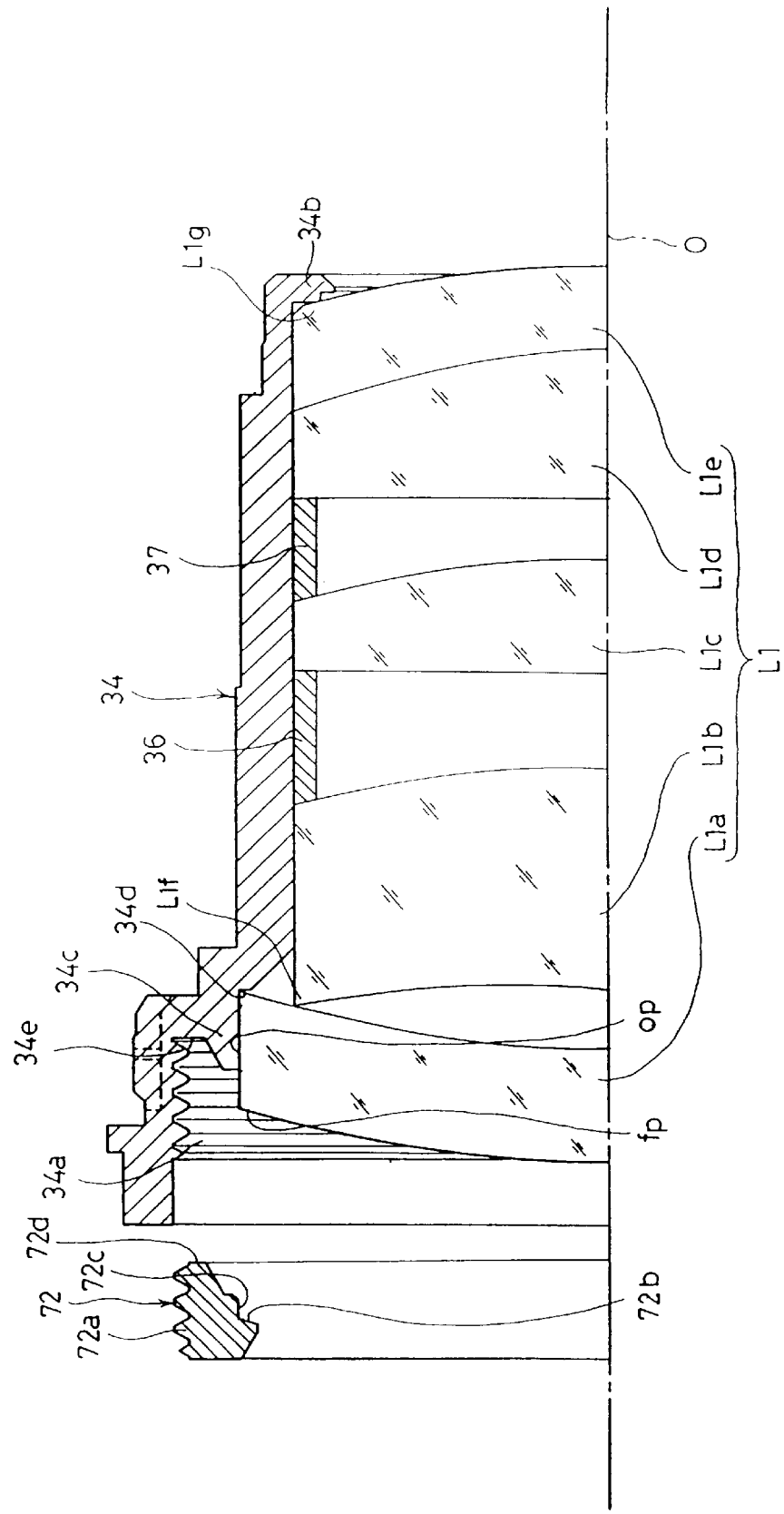
FIG. 30 is a sectional view of an upper part of a lens supporting barrel which supports a front lens group therein, and a lens fixing ring which is to be screw-engaged with the lens supporting barrel.

As shown in FIG. 30, the front lens group L1 consists of five lenses, namely a first lens (frontmost lens) L1a, a second lens L1b, a third lens L1c, a fourth lens L1d and a fifth lens L1e in this order from an object side to an image side, i.e., from the left hand side to the right hand side as viewed in FIG. 30.

A front positioning ring 36 for determining a distance between the second lens L1b and the third lens L1c is positioned and held between the second lens L1b and the third lens L1c. An outer peripheral surface of the positioning ring 36 is fitted on an inner peripheral surface of the lens supporting barrel 34. Likewise, a rear positioning ring 37 for determining a distance between the third lens L1c and the fourth lens L1d is positioned and held between the third lens L1c and the fourth lens L1d. An outer peripheral surface of the positioning ring 37 is fitted on an inner peripheral surface of the lens supporting barrel 34. The rear surface of the fourth lens L1d and the front surface of the fifth lens L1e are cemented to each other, so that the fourth and fifth lenses L1d, L1e are formed as a cemented or composite lens. A front circumferential edge L1f of the second lens L1b along the circumferential edge thereof contacts the rear surface of the first lens L1a. A rear circumferential edge L1g of the fifth lens L1e along the circumferential edge thereof contacts an inwardly-projecting flange 34b formed integral with the rear end of the lens supporting barrel 34.

Figure 31:
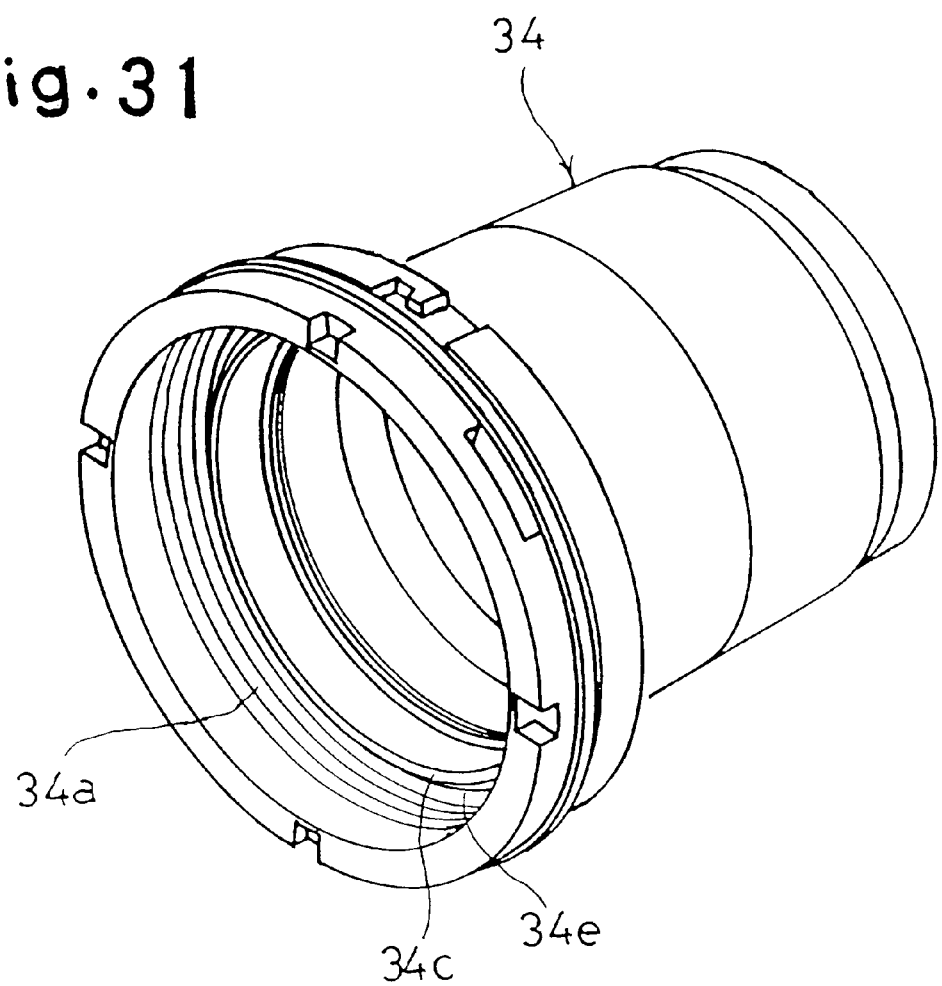
FIG. 31 is an enlarged perspective view of the lens supporting barrel shown in FIG. 30.

A female thread 34a is formed on an inner periphery of a front part of the lens supporting barrel 34, as shown in FIGS. 30 or 31. A lens fixing ring 72, for fixing the first lens L1a to the lens support barrel 34, engages with the lens supporting barrel 34. With this arrangement, a male thread 72a formed on the outer peripheral surface of the lens fixing ring 72 meshes with the female thread 34a. A circular abutting surface 72b is formed on the lens fixing ring 72 on an inner peripheral surface thereof. The circular abutting surface 72b comes into contact with a circumferential portion fp of the front surface of the first lens L1a in a state when the lens fixing ring 72 is properly screw-engaged with the lens supporting barrel 34. The circular abutting surface 72b is formed to be substantially parallel to the circumferential portion fp so that the circular abutting surface 72b and the circumferential portion fp may be brought tightly into contact with each other when the lens fixing ring 72 is properly screw-engaged with the lens supporting barrel 34.

A supporting ring portion 34c is formed integral with the lens supporting barrel 34. The supporting ring portion 34c is located inwardly from the female thread 34a in a radial direction of the lens supporting barrel 34. The inner peripheral surface of the supporting ring portion 34c, which extends in the optical axis direction, comes into contact with an outer circumferential edge or surface op of the first lens L1a. An annular positioning surface 34d, extending substantially normal to the optical axis 0, is formed on the lens supporting barrel 34 immediately behind the supporting ring portion 34c. The circumferential edge of the rear surface of the first lens L1a comes into contact with the positioning surface 34d. With this structure, the first lens L1a is immovably held between the circular abutting surface 72b and the positioning surface 34d in the optical axis direction, and the first lens L1a is immovably held by the supporting ring portion 34c in a radial direction normal to the optical axis 0.

Figure 32:
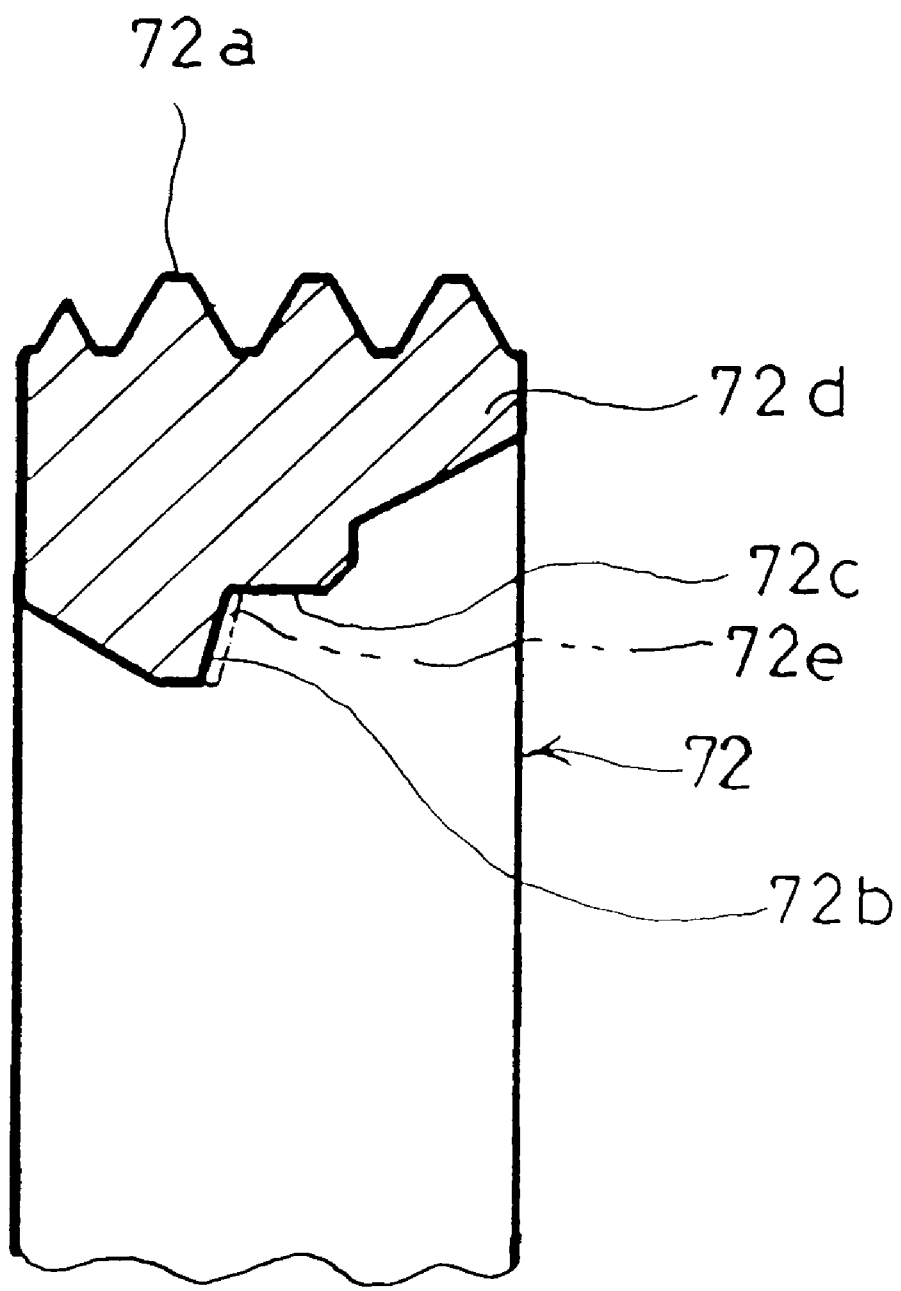
FIG. 32 is an enlarged sectional view of a part of the lens fixing ring shown in FIG. 30.

As shown in FIG. 32, a coating 72e is coated on the circular abutting surface 72b. The coating 72e is a waterproof coating made of a synthetic resin. In the present embodiment, Fantas Coat SF-6 (trademark of a coating produced by the Japanese Company "Origin Denki Kabushiki Kaisha") is used as the coating 72e. The front surface of the first lens L1a is formed very smooth, whereas the circular abutting surface 72b of the lens fixing ring 72 is not formed as smoothly (i.e., has a rough finish) as the front surface of the first lens L1a. This is because the first lens L1a is more minutely and accurately formed than the lens fixing ring 72 since the first lens L1a is a precision optical element. Because of the differences in the finishes, in the absence of the coating 72e on the circular abutting surface 72b, a substantial gap would be formed between the circular abutting surface 72b and the circumferential portion fp. This would be the case even if the circular abutting surface 72b was properly and tightly in contact with the circumferential portion fp by properly screw-engaging the lens fixing ring 72 with the female thread 34a. As a result, water or moisture would be able to penetrate into the lens supporting barrel 34 through the substantial gap. However, in the present embodiment, the coating 72e is applied to the circular abutting surface 72b so as to make the surface thereof a smooth surface which eliminates the substantial gap between the circular abutting surface 72b and the circumferential portion fp when the circular abutting surface 72b properly contacts the circumferential portion fp. Accordingly, the coating 72e, positioned and held between the circular abutting surface 72b and the circumferential portion fp, effectively prevents water or moisture from penetrating the lens supporting barrel 34 between the circular abutting surface 72b and the circumferential portion fp when the circular abutting surface 72b is properly and tightly in contact with the circumferential portion fp by properly screw-engaging the lens fixing ring 72 with the female thread 34a.

A circular surface 72c is formed on the lens fixing ring 72. The circular surface 72c is connected to the circular abutting surface 72b and is located immediately outward in a radial direction from the circular abutting surface 72b. A front part of the outer circumferential surface op of the first lens L1a (i.e., a circumferential edge of the first lens L1a) comes into contact with the circular surface 72c when the lens fixing ring 72 properly engages with the female thread 34a. Due to the circular surface 72c contacting the outer circumferential surface op, the watertight structure between the circular abutting surface 72b and the circumferential portion fp, that is realized by the coating 72e, is enhanced. That is, a highly efficient watertight connection between the first lens L1a and the lens fixing ring 72 is realized by providing both the coating 72e and the circular surface 72c with the lens fixing ring 72.

An annular recessed portion 34e is formed on the lens supporting barrel 34 between the female thread 34a and the supporting ring portion 34c. As shown in FIG. 20, in a state where the lens fixing ring 72 is properly screw-engaged with the female thread 34a, a rear end 72d of the lens fixing ring 72 is positioned in the annular recessed portion 34e with the rear end 72d not contacting the bottom (i.e., rearmost end) of the recessed portion 34e. In particular, an annular space is formed in the annular recessed portion 34e between the rear end 72d and the bottom of the recessed portion 34e.

The fixed lens barrel block 12 is fixed in front of an aperture plate 14 fixed to the camera body. The aperture plate 14 is provided on a center thereof with a rectangular-shaped aperture 14a which forms the limits of each frame exposed. The fixed lens barrel block 12 is provided on an inner periphery of the cylindrical portion 12p, with a female helicoid 12a, and also a plurality of linear guide grooves 12b each extending parallel to the optical axis 0, i.e., extending in the optical axis direction. At the bottom of one of the linear guide grooves 12b, namely 12b', a code plate 13a, having a predetermined code pattern, is fixed. The code plate 13a extends in the optical axis direction and extends along substantially the whole of the length of the fixed lens barrel block 12. The code plate 13a is part of a flexible printed circuit board 13 positioned outside the fixed lens barrel block 12.

Figure 16:
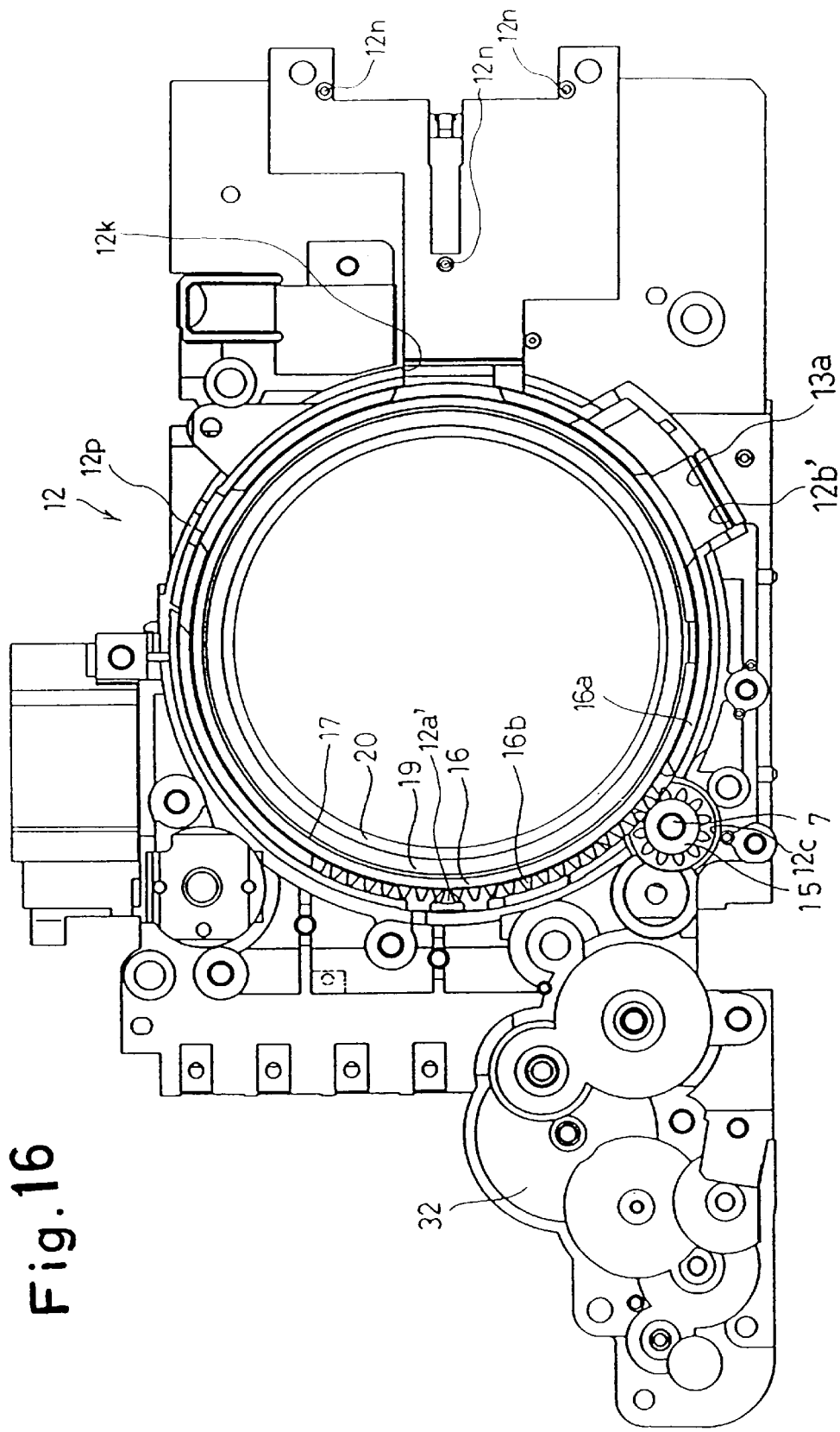
FIG. 16 is a front elevational view of the fixed lens barrel block shown in FIG. 3 with other members installed in the fixed lens barrel block.

As shown in FIGS. 1, 3, 16 and 21, in the fixed lens barrel block 12, a gear housing 12c is provided which is recessed outwardly from an inner periphery of the cylindrical portion 12p of the fixed lens barrel block 12 in a radial direction while extending in the optical axis direction. In the gear housing 12c, a driving pinion 15 is rotatably held and extends in the optical axis direction. Both ends of an axial shaft 7 of the driving pinion 15 are rotatively supported by a supporting hollow 4, provided in the fixed lens barrel block 12, and a supporting hollow 31a, provided on a gear supporting plate 31 fixed on the fixed lens barrel block 12 by set screws (not shown), respectively. Part of the teeth of the driving pinion 15 project inwardly from the inner periphery of the cylindrical portion 12p of the fixed lens barrel block 12 so that the driving pinion 15 meshes with an outer peripheral gear 16b of the third moving barrel 16, as shown in FIG. 16.

Figure 11:
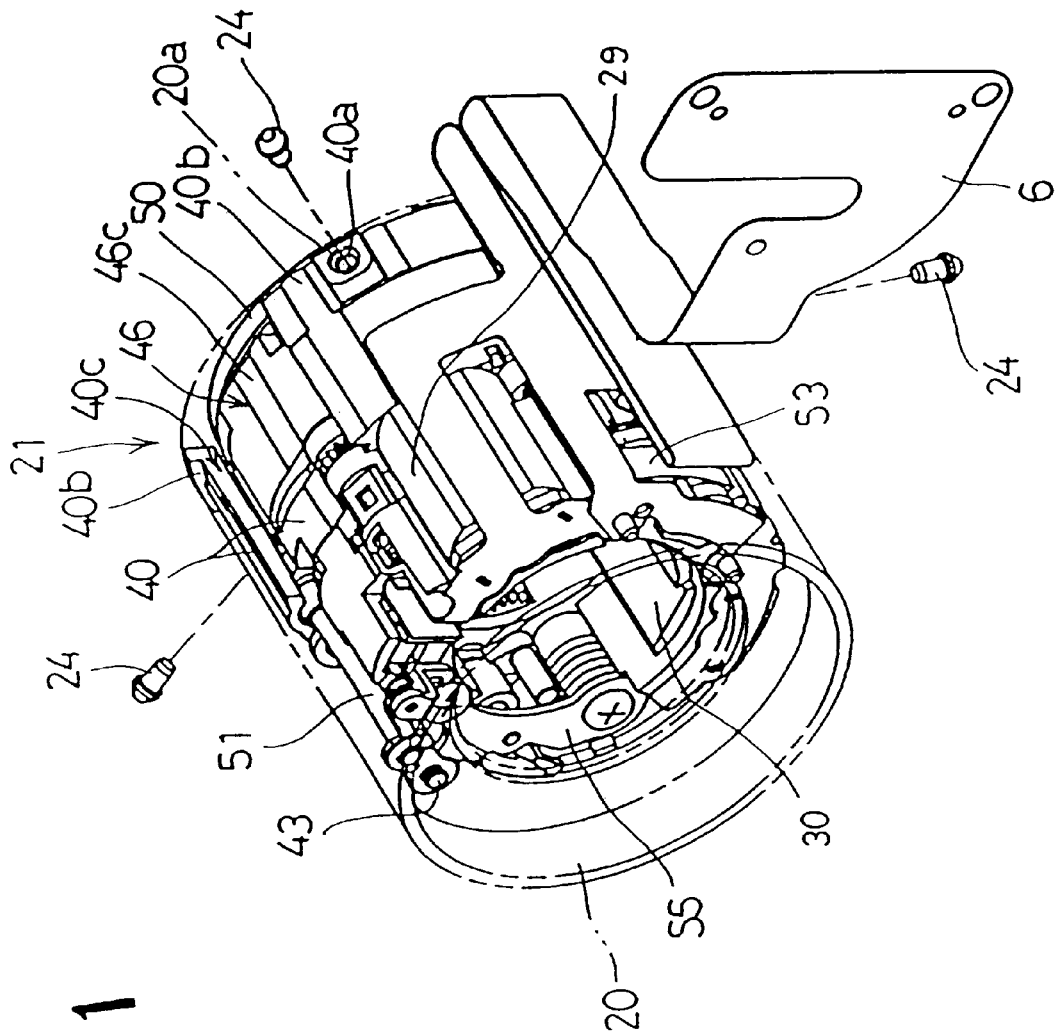
FIG. 11 is a schematic perspective view illustrating a state where an AF/AE shutter unit of the zoom lens barrel is mounted to a first moving barrel.
Figure 12:
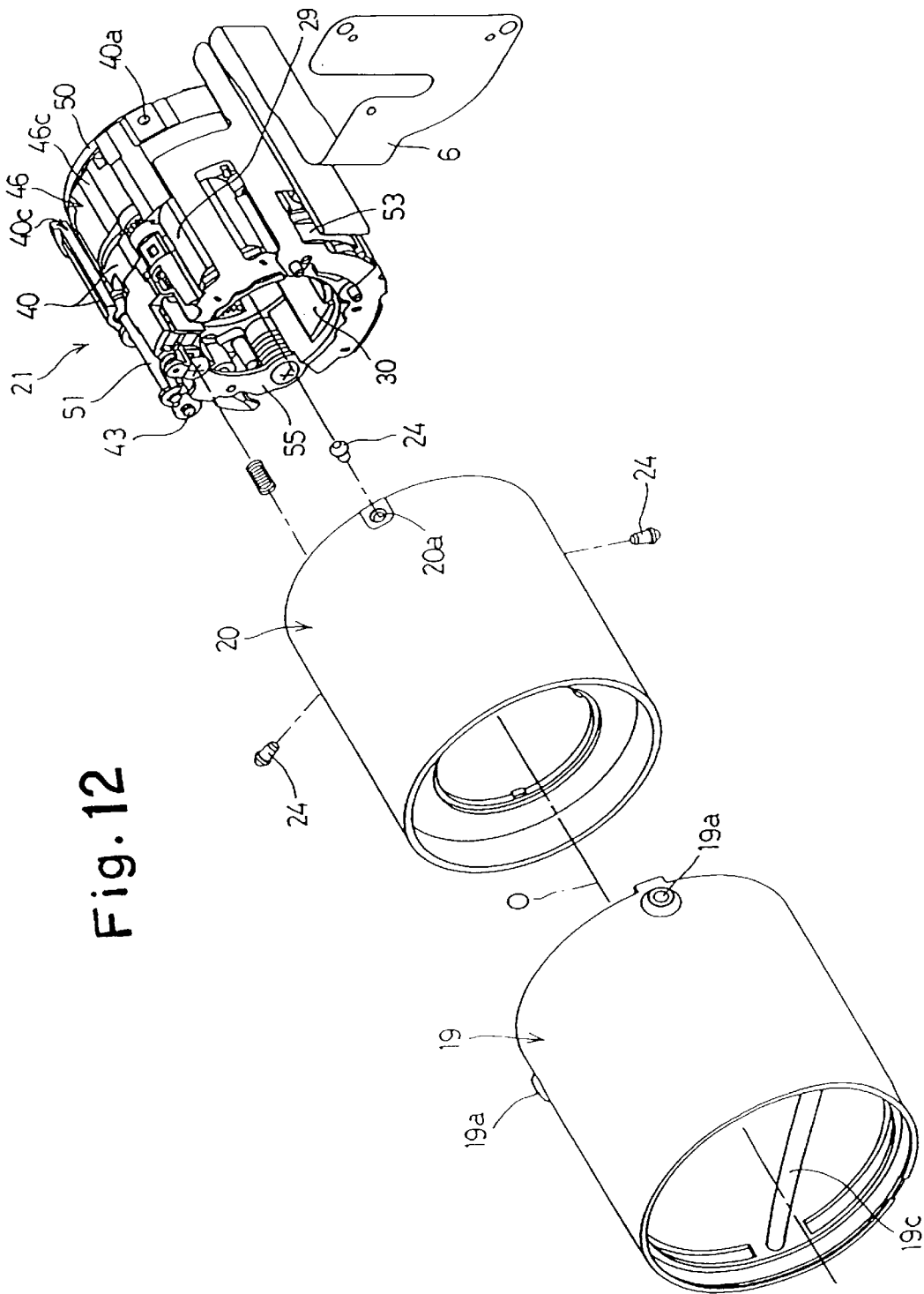
FIG. 12 is an enlarged exploded perspective view of a part of the zoom lens barrel.

The fixed lens barrel block 12 is provided on one side (the left side as viewed in FIG. 1) with an integrally formed supporting member 32. The whole optical unit driving motor 25 is secured to the rear of the supporting member 32. A gear train 26 consisting of a plurality of gears is accommodated to be supported in the supporting member 32 on the front of the supporting member 32. The fixed lens barrel block 12 is further provided on the other side (opposite to the side having the supporting member 32) with an integrally formed stationary plate 12m. A plurality of projections 12n are integrally formed on the front of the stationary plate 12m, projecting towards the object side in the optical axis direction. The fixed lens barrel block 12 is further provided, between the stationary plate 12m and the cylindrical portion 12p, with a cutout portion 12k extending in the optical axis direction. The cutout portion 12k is formed by cutting out a part of the cylindrical portion 12p. One end of a flexible printed circuit board 6 is fixed and supported on the front of the stationary plate 12m by the projections 12n, with an intermediate part of the flexible printed circuit board 6 being laid along the cutout portion 12k. The other end of the flexible printed circuit board 6 is secured to the AF/AE shutter unit 21 as shown in FIG. 11.

Figure 14:
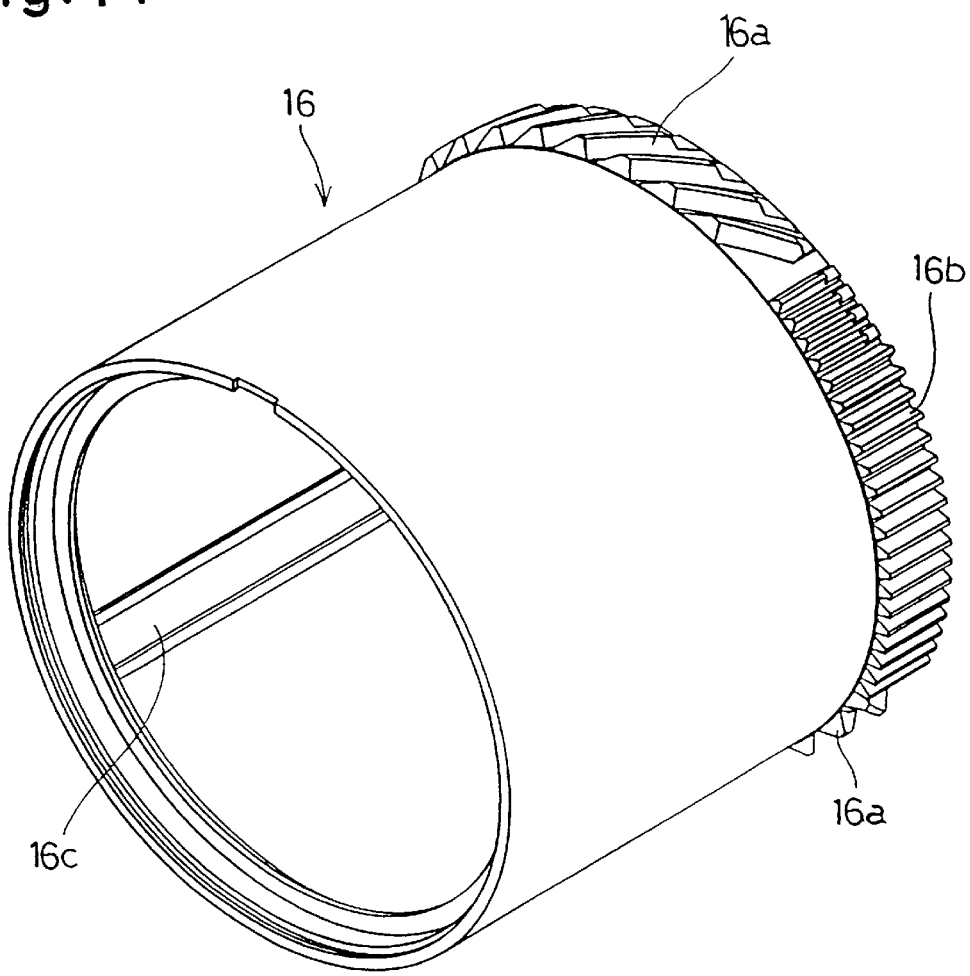
FIG. 14 is an enlarged schematic perspective view of the third moving barrel shown in FIG. 4 shown from a different angle.

On an inner periphery of the third moving barrel 16, a plurality of linear guide grooves 16c are formed, each extending parallel to the optical axis 0. At an outer periphery of the rear end of the third moving barrel 16, a male helicoid 16a and the aforementioned outer peripheral gear 16b are provided as shown in FIG. 14. The male helicoid 16a engages with the female helicoid 12a of the fixed lens barrel block 12. The outer peripheral gear 16b engages with the driving pinion 15. The driving pinion 15 has an axial length sufficient to be capable of engaging with the outer peripheral gear 16b throughout the entire range of movement of the third moving barrel 16 in the optical axis direction.

Figure 15:
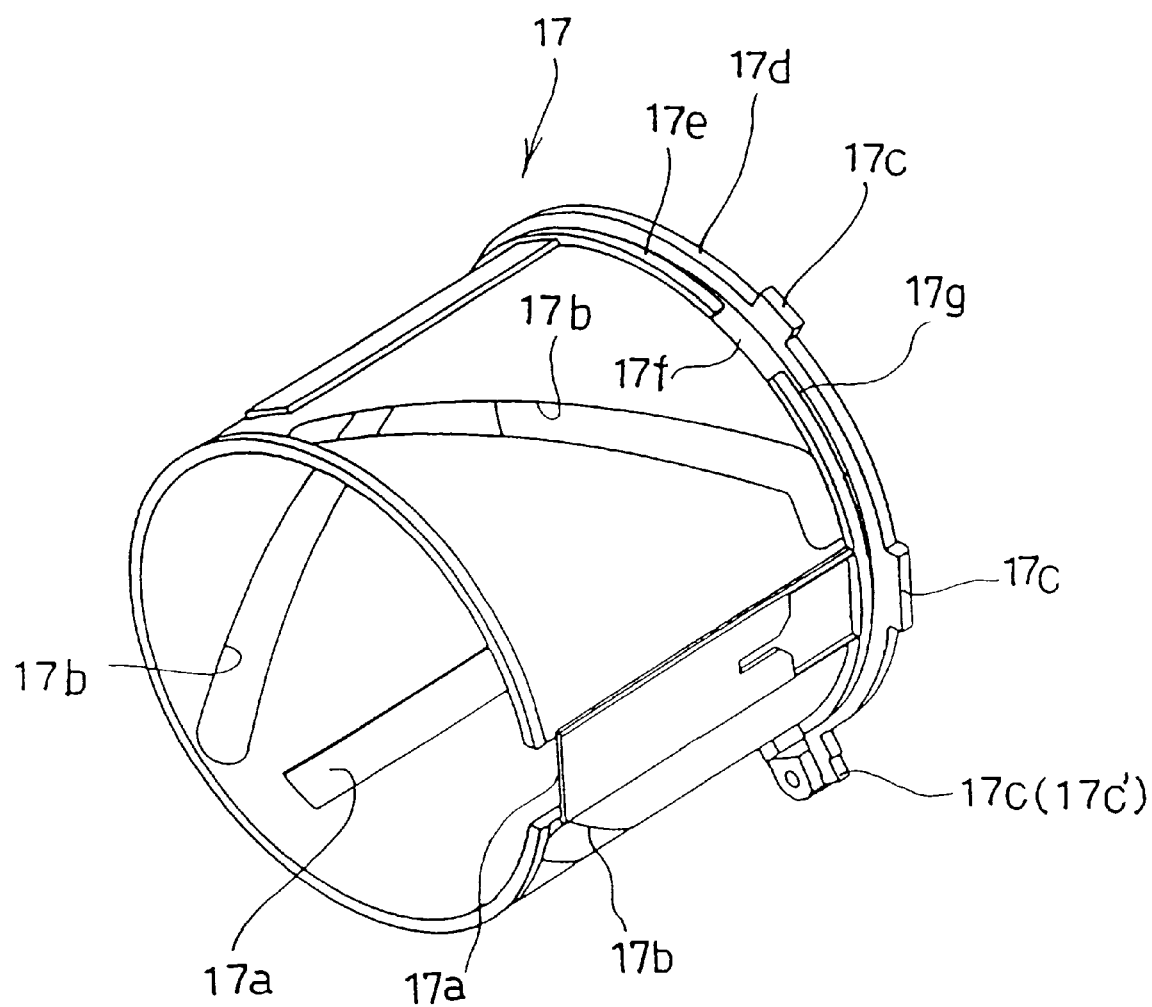
FIG. 15 is an enlarged perspective view of a linear guide barrel of the zoom lens barrel.

As shown in FIG. 15, the linear guide barrel 17 is provided, on a rear part of an outer periphery thereof, with a rear end flange 17d. The rear end flange 17d has a plurality of engaging projections 17c each projecting away from the optical axis 0 in a radial direction. The linear guide barrel 17 is further provided with a retaining flange 17e in front of the rear end flange 17d. A circumferential groove 17g is formed between the rear end flange 17d and the retaining flange 17e. The retaining flange 17e has a radius smaller than the rear end flange 17d. The retaining flange 17e is provided with a plurality of cutout portions 17f. Each of the cutout portions 17f allows a corresponding engaging projection 16d to be inserted into the circumferential groove 17g, as shown in FIG. 20.

The third moving barrel 16 is provided, on an inner periphery of the rear end thereof, with a plurality of engaging projections 16d. Each of the engaging projections 16d projects towards the optical axis 0 in a radial direction. By inserting the engaging projections 16d into the circumferential groove 17g, through the corresponding cutout portions 17f, the engaging projections 16d are positioned in the circumferential groove 17g between the flanges 17d and 17e (see FIG. 20). By rotating the third moving barrel 16 relative to the linear guide barrel 17, the engaging projections 16d are engaged with the linear guide barrel 17.

An aperture plate 23 having a rectangular-shaped aperture 23a approximately the same shape as the aperture 14a is fixed to the read-end of the linear guide barrel 17.

The relative rotation of the linear guide barrel 17, with respect to the fixed lens barrel block 12, is restricted by the slidable engagement of the plurality of engaging projections 17c with the corresponding linear guide grooves 12b, formed parallel to the optical axis 0.

A contacting terminal 9 is fixed to one of the engaging projections 17c, namely 17c'. The contacting terminal 9 is in slidable contact with the code plate 13a, fixed to the bottom of the linear guide groove 12b' to generate signals corresponding to focal length information during zooming.

A plurality of linear guide grooves 17a are formed on the inner periphery of the linear guide barrel 17, each extending parallel to the optical axis 0. A plurality of lead slots (cam slots) 17b are also formed on the linear guide barrel 17 as shown in FIGS. 15 or 21. The lead slots 17b are each formed oblique (inclined) to the optical axis 0.

The second moving barrel 19 engages with the inner periphery of the linear guide barrel 17. On the inner periphery of the second moving barrel 19, a plurality of lead grooves 19c are provided in a direction inclined oppositely to the lead slots 17b. Each lead groove 19c is oblique to both the optical axis direction and a circumferential direction of the linear guide barrel 17 by a predetermined angle, similar to each lead slot 17b. On the outer periphery of the rear end of the second moving barrel 19, a plurality of follower projections 19a are provided. Each of the follower projections 19a has a trapezoidal cross-sectional shape projecting away from the optical axis 0 in a radial direction. Follower pins 18 are positioned in the follower projections 19a. Each follower pin 18 consists of a ring member 18a, and a center fixing screw 18b which supports the ring member 18a on the corresponding follower projection 19a. The follower projections 19a are in slidable engagement with the lead slots 17b of the linear guide barrel 17, and the follower pins 18 are in slidable engagement with the linear guide grooves 16c of the third moving barrel 16. With such an arrangement, when the third moving barrel 16 rotates, the second moving barrel 19 moves linearly in the optical axis direction, while rotating.

On the inner periphery of the second moving barrel 19, the first moving barrel 20 is engaged. The first moving barrel 20 is provided on an outer periphery of the rear thereof with a plurality of follower pins 24 each engaging with the corresponding inner lead groove 19c. At the same time the first moving barrel 20 is guided linearly by a linear guide member 22. The first moving barrel 20 is provided at the front end thereof with a decorative plate 41.

Figure 9:
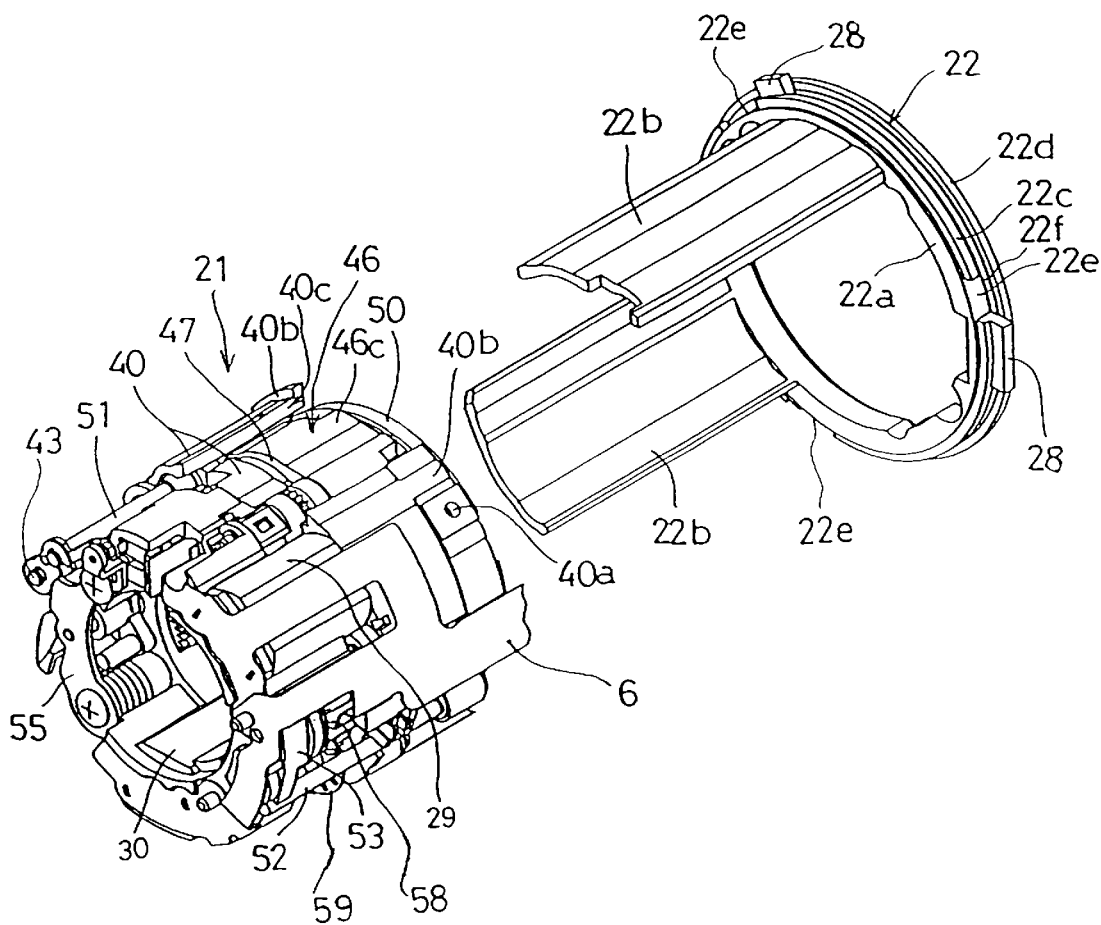
FIG. 9 is an enlarged schematic perspective view showing a part of a zoom lens barrel.
Figure 10:
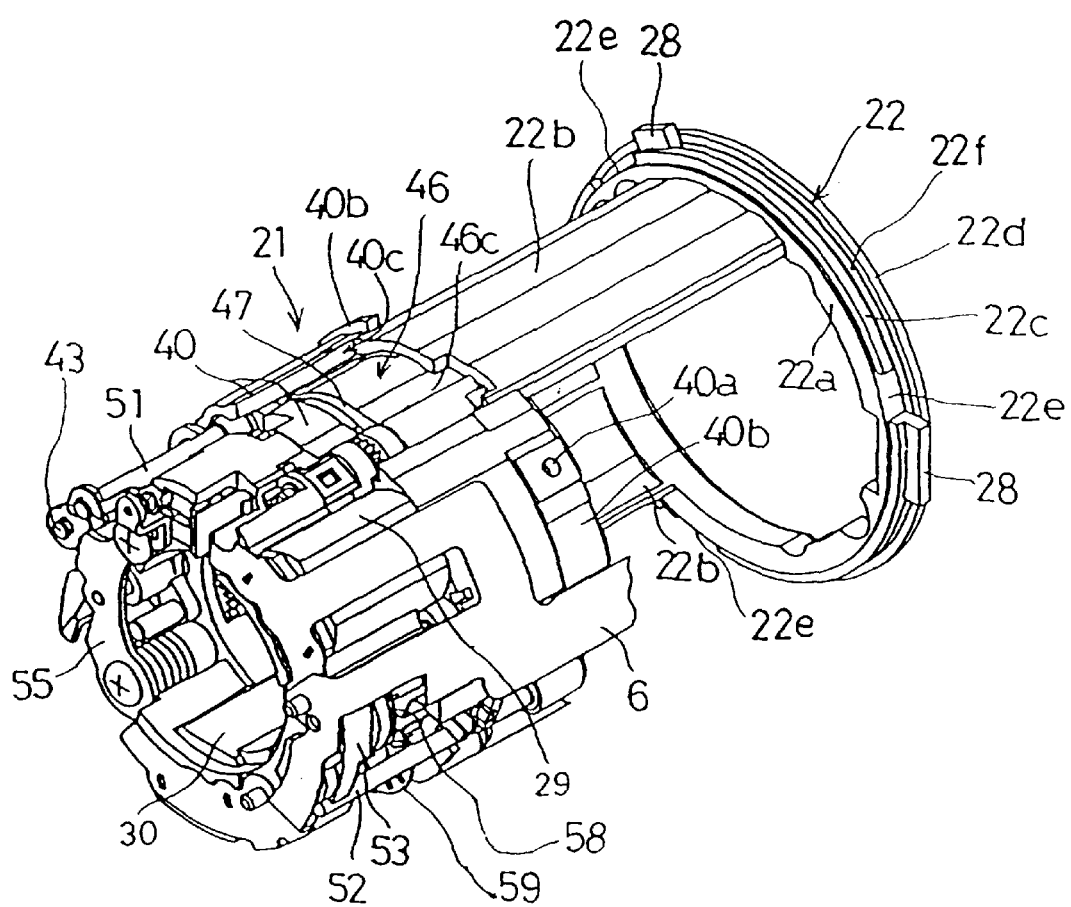
FIG. 10 is a schematic perspective view showing the part of the zoom lens barrel shown in FIG. 9 in an engaged state.

As shown in FIGS. 9 and 10, the linear guide member 22 is provided with an annular member 22a, a pair of guide legs 22b and a plurality of engaging projections 28. The pair of guide legs 22b project from the annular member 22a in the optical axis direction. The plurality of engaging projections 28 each project from the annular member 22a away from the optical axis 0 in a radial direction. The engaging projections 28 slidably engage with the linear guide grooves 17a. The guide legs 22b are respectively inserted into linear guides 40c between the inner peripheral surface of the first moving barrel 20 and the AF/AE shutter unit 21.

The annular member 22a of the linear guide member 22 is connected to the rear of the second moving barrel 19, such that the linear guide member 22 and the second moving barrel 19 are capable of moving along the optical axis 0 as a whole and relatively rotating around the optical axis 0. The linear guide member 22 is further provided on the outer periphery of the rear end with a rear end flange 22d. The linear guide member 22 is further provided in front of the rear end flange 22d with a retaining flange 22c. A circumferential groove 22f is formed between the rear end flange 22d and the retaining flange 22c. The retaining flange 22c has a smaller radius than the rear end flange 22d. The retaining flange 22c is provided with a plurality of cutout portions 22e, as shown in FIGS. 9 or 10, each allowing a corresponding engaging projection 19b to be inserted into the circumferential groove 22f, as shown in FIG. 20.

The second moving barrel 19 is provided on an inner periphery of the rear end thereof with a plurality of engaging projections 19b, each projecting towards the optical axis 0 in a radial direction. By inserting the engaging projections 19b into the circumferential groove 22f through the corresponding cutout portions 22e, the engaging projections 19b are positioned in the circumferential groove 22f between the flanges 22c and 22d. By rotating the second moving barrel 19 relative to the linear guide member 22, the engaging projections 19b are engaged with the linear guide member 22. With the above structure, when the second moving barrel 19 rotates in the forward or reverse rotational direction, the first moving barrel 20 moves linearly forwardly or rearwardly along the optical axis 0, but is restricted from rotating.

Figure 18:
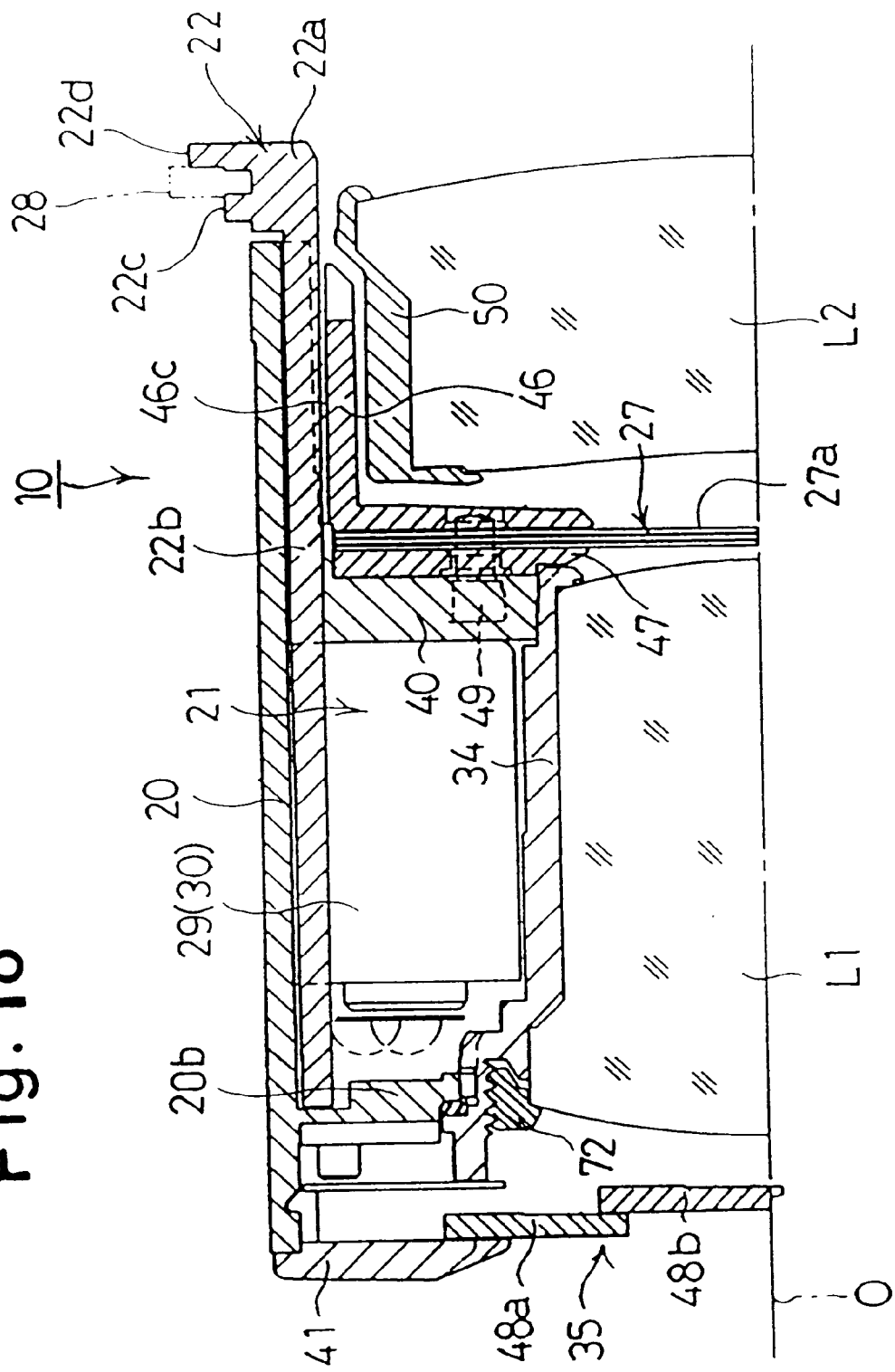
FIG. 18 is a sectional view of an upper part of the zoom lens barrel, illustrating elements in a housed state.

At the front of the first moving barrel 20, a barrier apparatus 35 having barrier blades 48a and 48b is mounted. On an inner peripheral face of the first moving barrel 20, the AF/AE shutter unit 21 having the shutter 27, consisting of three shutter blades 27a, is engaged and fixed as shown in FIG. 18. The AF/AE shutter unit 21 is provided with a plurality of fixing holes 40a formed at even angular intervals on the outer periphery of the shutter mounting stage 40. Only one of the fixing holes 40a appears in each of FIGS. 9–13.

The aforementioned plurality of follower pins 24, which engage with the inner lead grooves 19c, also serve as a device for fixing the AF/AE shutter unit 21 to the first moving barrel 20. The follower pins 24 are inserted in holes 20a, formed on the first moving barrel 20, and fixed in the fixing holes 40a. With this arrangement the AF/AE shutter unit 21 is secured to the first moving barrel 20 as shown in FIG. 11. In FIG. 11 the first moving barrel 20 is indicated by phantom lines. The follower pins 24 may be fixed by an adhesive, or the pins 24 may be formed as screws to be screwed into the fixing holes 40a.

Figure 13:
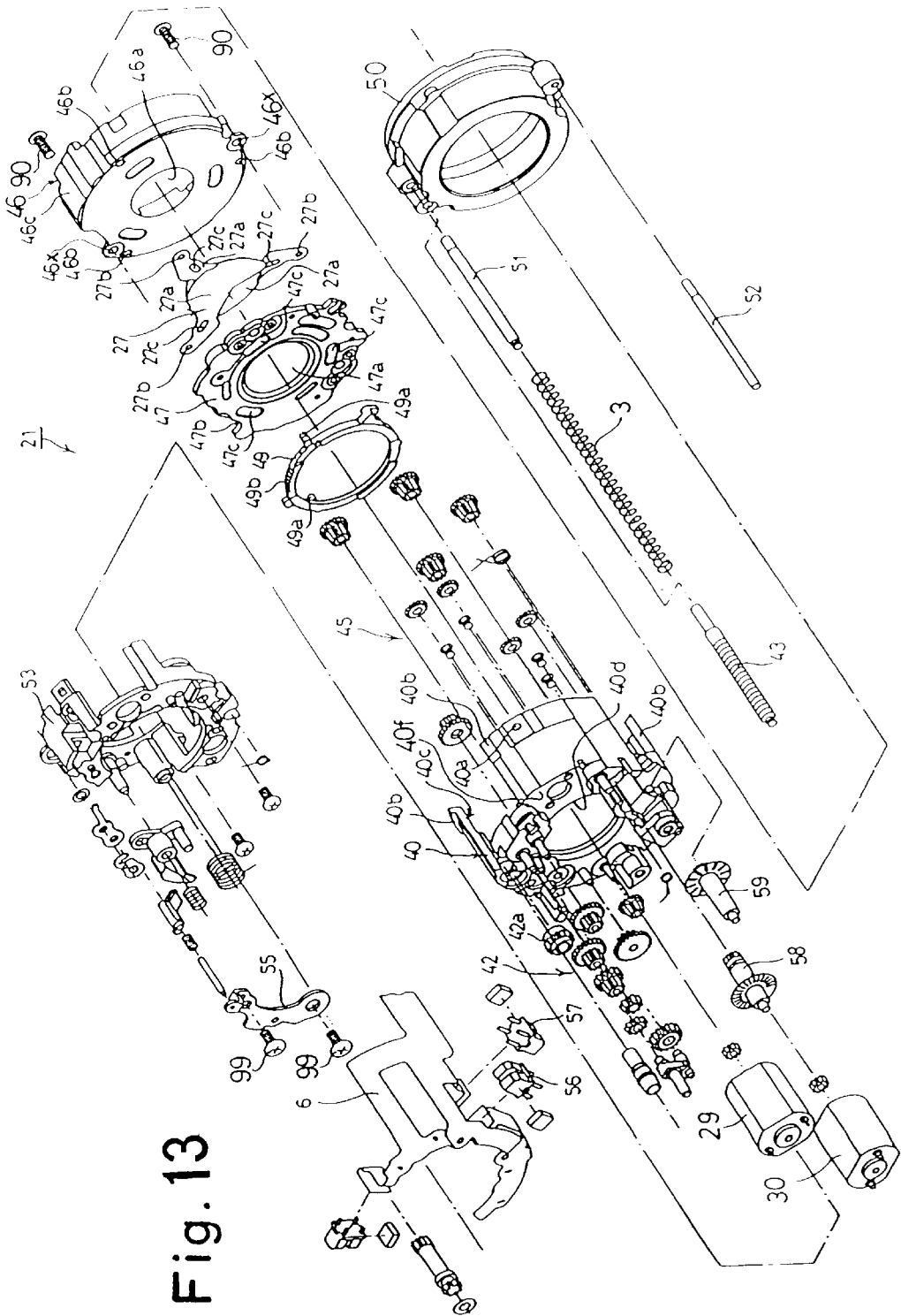
FIG. 13 is an exploded perspective view illustrating main parts of the AF/AE shutter unit of the zoom lens barrel shown in FIGS. 9, 10, 11 or 12.
Figure 21:
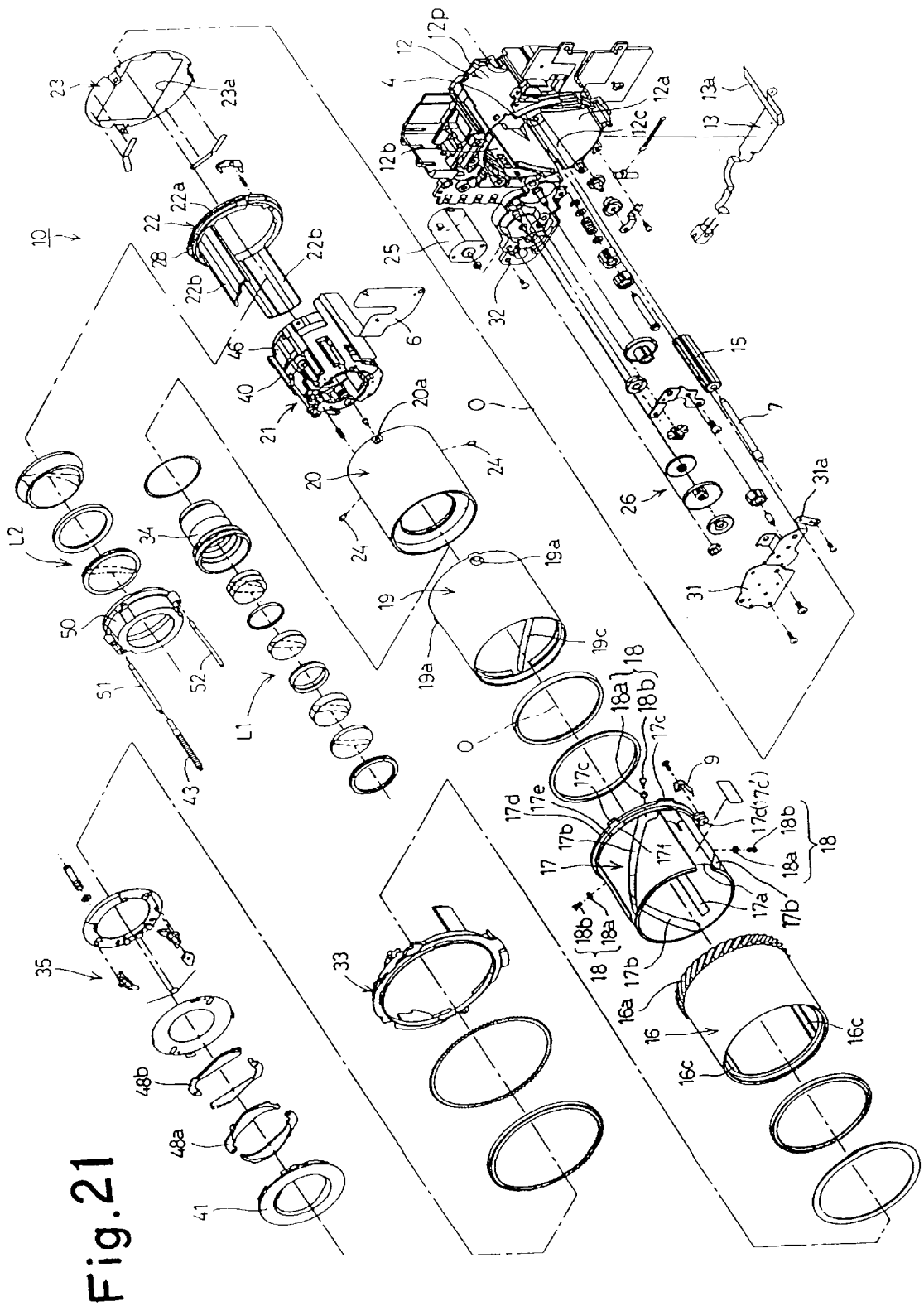
FIG. 21 is an exploded perspective view of the overall structure of the zoom lens barrel.

As illustrated in FIGS. 13 and 21, the AF/AE shutter unit 21 is provided with the shutter mounting state 40, a shutter blade supporting ring 46 fixed on the rear of the shutter mounting stage 40 so as to be located inside the shutter mounting stage 40, and the lens supporting barrel 50 supported in a state of being capable of movement relative to the shutter mounting stage 40. The shutter mounting stage 40 supports the lens supporting barrel 34, the AE motor 29, and the rear lens group driving motor 30. The shutter mounting stage 40 is provided with an annular member 40f having a circular aperture 40d. The shutter mounting stage 40 is also provided with three legs 40b which project rearward from the annular member 40f. Three slits are defined between the three legs 40b. Two of the slits comprise the aforementioned linear guides 40c, which slidably engage with the respective pair of guide legs 22b of the linear guide member 22 so as to guide the movement of the linear guide member 22.

The shutter mounting stage 40 supports an AE gear train 45 which transmits a rotation of the AE motor 29 to the shutter 27, a lens driving gear train 42 which transmits rotation of the rear lens group driving motor 30 to a screw shaft 43, photointerrupters 56 and 57 which are connected to a flexible printed circuit board 6, and rotating disks 58 and 59 which have a plurality of radially formed slits provided in the circumferential direction. An encoder for detecting whether the rear lens group driving motor 30 is rotating and for detecting an amount of rotation of the rear lens group driving motor 30 consists of the photointerrupter 57 and the rotating disk 59. An AE motor encoder for detecting whether the AE motor 29 is rotating and for detecting an amount of rotation of the AE motor 29 consists of the photointerrupter 56 and the rotating disk 58.

The shutter 27, a supporting member 47 which pivotally supports the three shutter blades 27a of the shutter 27, and a circular driving member 49, which gives rotative power to the shutter blades 27a, are positioned between the shutter mounting stage 40 and the shutter blade supporting ring 46, secured to the shutter mounting stage 40. The circular driving member 49 is provided with three operating projections 49a at even angular intervals, which respectively engage with each of the three shutter blades 27a. As shown in FIG. 13, the front end of the shutter blade supporting ring 46 is provided with a circular aperture 46a and with three supporting holes 46b positioned at even angular intervals around the circular aperture 46a. Two deflection restricting surfaces 46c are formed on the outer periphery of the shutter blade supporting ring 46. Each deflection restricting surface 46c is exposed outwardly from the corresponding linear guide 40c and slidably supports the inner peripheral face of the corresponding guide leg 22b.

The supporting member 47, positioned in front of the shutter blade supporting ring 46, is provided with a circular aperture 47a, that is aligned with the circular aperture 46a of the shutter blade supporting ring 46, and with three pivotal shafts 47b (only one of which is illustrated in FIG. 13) at respective positions opposite the three supporting holes 46b. Each shutter blade 27a is provided at one end with a hole 27b into which the corresponding pivotal shaft 47b is inserted so that each shutter blade 27a is rotatable about the corresponding pivotal shaft 47b. The major part of each shutter blade 27a that extends normal to the optical axis 0 from the pivoted end is formed as a light interceptive portion. All three light interceptive portions of the shutter blades 27a together prevent ambient light, which enters the front lens group L1, from entering the circular apertures 46a and 47a when the shutter blades 27a are closed. Each shutter blade 27a is further provided between the hole 27b and the light interceptive portion is provided with a slot 27c, through which the corresponding operating projection 49a is inserted. The supporting member 47 is fixed to the shutter blade supporting ring 46 in such a manner that each shaft 47b, which supports the corresponding shutter blade 27a, is engaged with the corresponding supporting hole 46b of the shutter blade supporting ring 46.

A gear portion 49b is formed on a part of the outer periphery of the circular driving member 49. The gear portion 49b meshes with one of the plurality of gears in the gear train 45 to receive the rotation from the gear train 45. The supporting member 47 is provided, at respective positions close to the three pivotal shafts 47b, with three arc grooves 47c each arched along a circumferential direction. The three operating projections 49a of the circular driving ring 49 engage with the slots 37c of the respective shutter blades 27a through the respective arc grooves 47c. The shutter blade supporting ring 46 is inserted from the rear of the shutter mounting stage 40, to support the circular driving ring 49, the supporting member 47 and the shutter 27, and is fixed on the shutter mounting stage 40 by set screws 90 respectively inserted through holes 46x provided on the shutter blade supporting ring 46.

Behind the shutter blade supporting ring 46, the lens supporting barrel 50, supported to be able to move relative to the shutter mounting stage 40 via guide shafts 51 and 52, is positioned. The shutter mounting stage 40 and the lens supporting barrel 50 are biased in opposite directions away from each other by a coil spring 3 fitted on the guide shaft 51, and therefore play between the shutter mounting stage 40 and the lens supporting barrel 50 is reduced. In addition, a driving gear 42a, provided as one of the gears in the gear train 42, is provided with a female thread hole (not shown) at the axial center thereof and is restricted to move in the axial direction. The screw shaft 43, one end of which is fixed to the lens supporting barrel 50, engages with the female thread hole. Accordingly, the driving gear 42a and the screw shaft 43 together constitute a feed screw mechanism. In such a manner, when the driving gear 42a rotates forwardly or reversely due to driving by the rear lens group driving motor 30, the screw shaft 43 respectively moves forwardly or rearwardly with respect to the driving gear 42a, and therefore the lens supporting barrel 50, which supports the rear lens group L2, moves relative to the front lens group L1.

A holding member 53 is fixed at the front of the shutter mounting stage 40. The holding member 53 holds the motors 29 and 30 between the holding member 53 and the shutter mounting stage 40. The holding member 53 has a metal holding plate 55 fixed at the front thereof by set screws 99. The motors 29, 30 and the photointerrupters 56, 57 are connected to the flexible printed circuit board 6. One end of the flexible printed circuit board 6 is fixed to the shutter mounting stage 40.

After the first, second and third moving barrels 20, 19 and 16, and the AF/AE shutter unit 21, etc. are assembled, the aperture plate 23 is fixed to the rear of the linear guide barrel 17, and an annular retaining member 33 is fixed at the front of the fixed lens barrel block 12.

Figure 1:
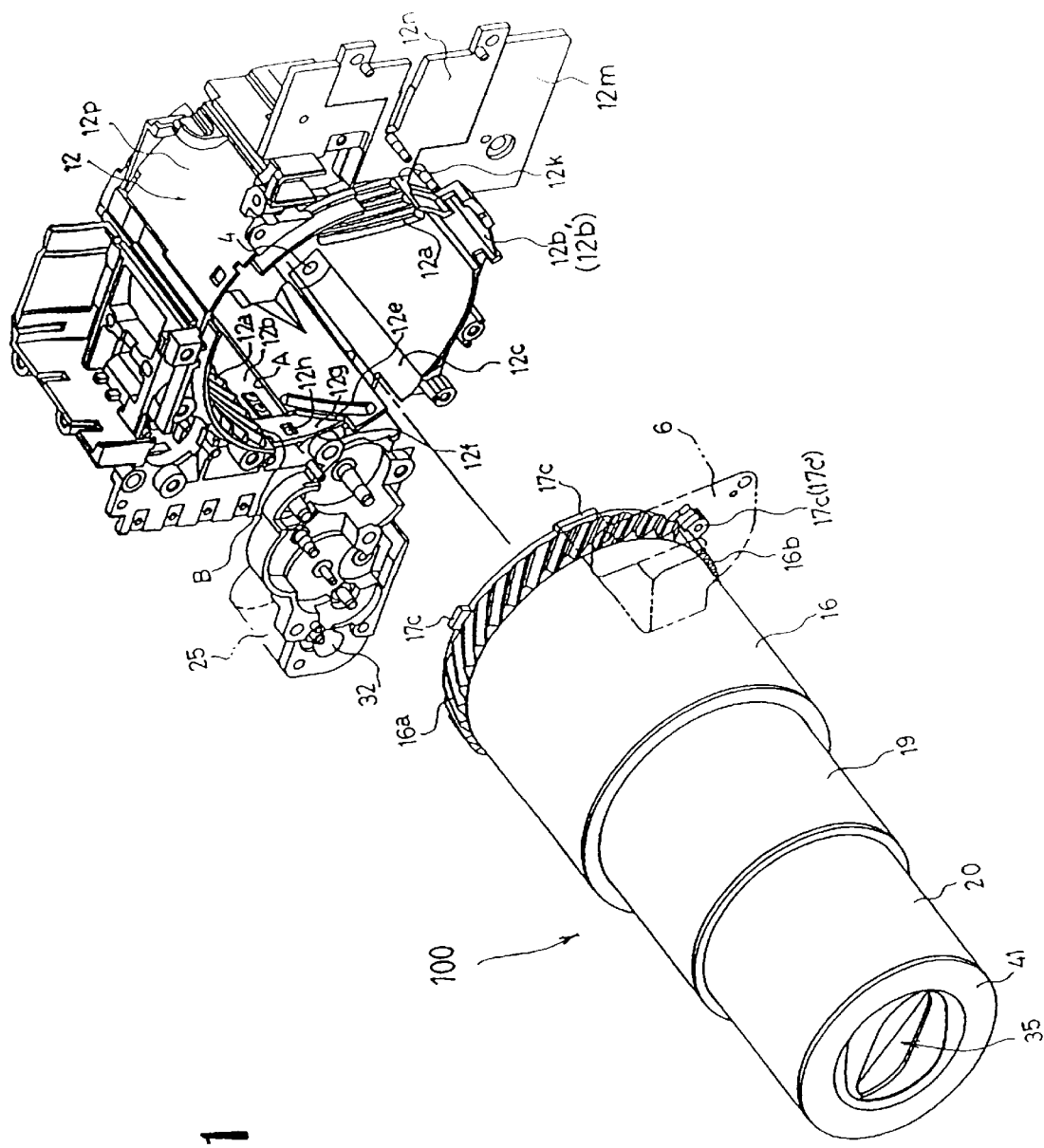
FIG. 1 is a schematic perspective view of a fixed lens barrel block and a zoom lens barrel unit provided in a zoom lens camera, illustrating a state before the zoom lens barrel unit is installed in the fixed lens barrel block.
Figure 2:
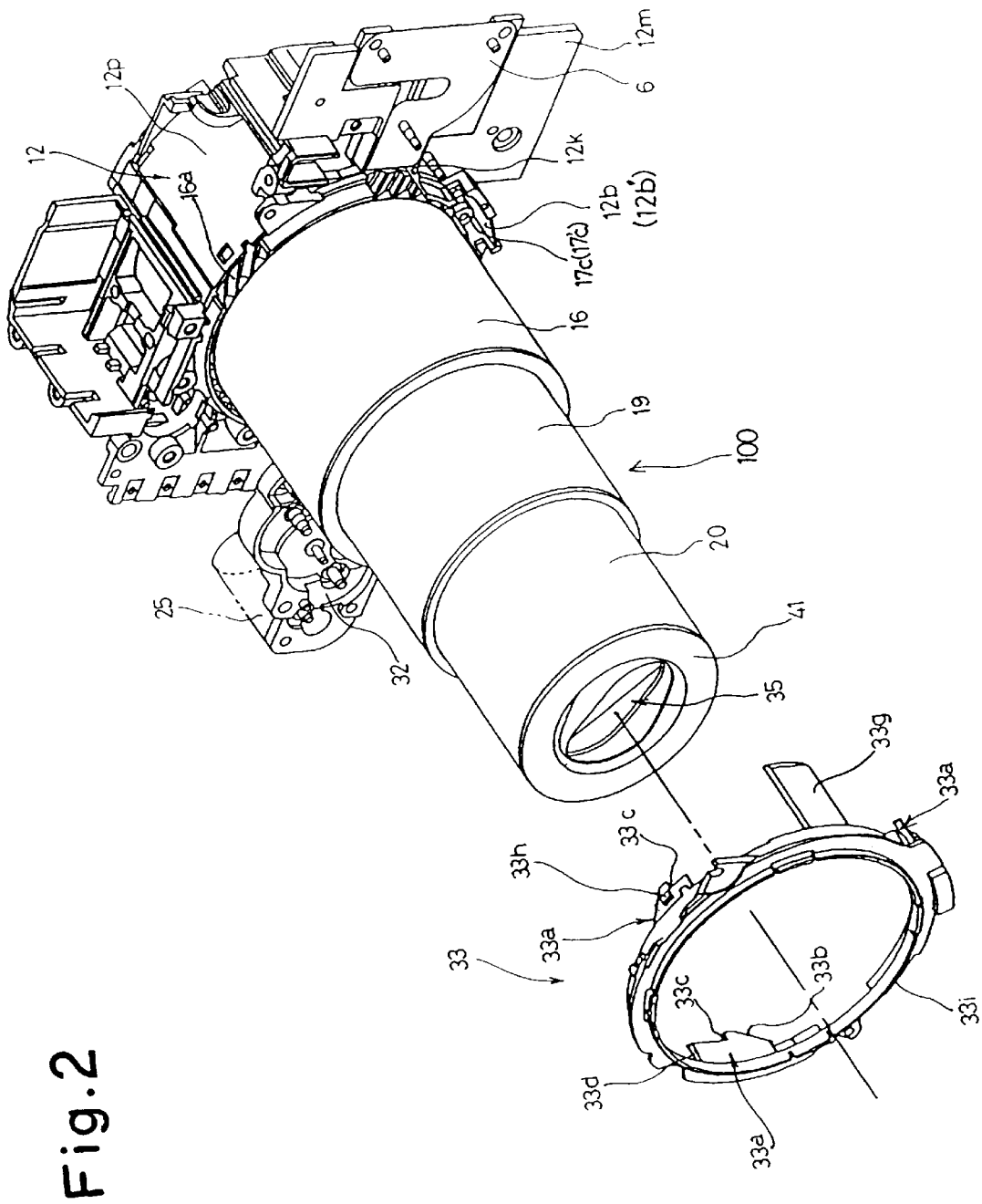
FIG. 2 is a schematic perspective view of the fixed lens barrel block, the zoom lens barrel unit and an annular fixing member, illustrating a state after the zoom lens barrel unit is installed in the fixed lens barrel block.

During an assembly of the zoom lens camera of the present embodiment, a zoom lens barrel unit 100, which consists of the first, second and third moving barrels 16, 19 and 20, the AF/AE shutter unit 21, the front and rear lens groups L1, L2, etc., is assembled in advance as a separate unit from the fixed lens barrel block 12. Thereafter, the zoom lens barrel unit 100 is installed in a housing of the fixed lens barrel block 12, i.e., in the cylindrical portion 12p, as shown in FIGS. 1 or 2.

With the zoom lens camera of the present embodiment, a different installing method is used than in a conventional zoom lens camera which is less troublesome and reduces the time necessary for installing the zoom lens barrel unit in the housing. In order to utilize the improved installing method, a new type of linear guide mechanism in the zoom lens barrel 10 has been realized, which is unique to the zoom lens camera of the present embodiment for guiding the linear guide barrel 17 along the optical axis 0 without rotating about the optical axis 0.

With the linear guide mechanism of the present embodiment, a dedicated space is not necessary for the sole purpose of installing or detaching the zoom lens barrel unit 100 in or from the cylindrical portion 12p. Thus, the size of the zoom lens barrel unit 100 can be reduced, contributing to the realization of a compact zoom lens camera. Such a linear guide mechanism will be discussed with reference to FIGS. 1–8.

The basic process of such an installing method in the zoom lens camera of the present embodiment will now be discussed. Firstly, as shown in FIG. 1, the zoom lens barrel unit 100 is prepared in its most extended state. Secondly, while maintaining such a state, the rear end of the zoom lens barrel unit 100 is brought into engagement with the front end of the cylindrical portion 12p in a predetermined positional relationship, as shown in FIG. 2. Thereafter, the whole optical unit driving motor 25 is driven to rotate the drive pinion 15 (see, for example, FIG. 21) in a predetermined rotational direction, so that the male helicoid 16a of the third moving barrel 16 engages with the female helicoid 12a.

Since the third moving barrel 16 and the cylindrical portion 12p are engaged with each other through the male and female helicoids 16a, 12a, i.e., through a threaded engagement when the third moving barrel 16 is brought into engagement with the cylindrical portion 12p, it is necessary for the third moving barrel 16 to be rotated from a predetermined initial position of engagement to an engagement completion position (i.e., the front extremity of the actual movable range of the third moving barrel 16 for zooming relative to the cylindrical portion 12p), about the optical axis 0 relative to the cylindrical portion 12p by a predetermined rotational amount. Namely, since the male helicoid 16a and the outer peripheral gear 16b are formed on the third moving barrel 16 along a common outer circumferential surface at the rear end of the third moving barrel 16 as shown in FIG. 14, the male and female helicoids 16a and 12a can only engage with each other after the third moving barrel 16 has been located at a predetermined rotational position relative to the female helicoid 12a. Furthermore, the plurality of engaging projections 17c, which respectively engage with the plurality of linear guide grooves 12b, need to be at respective predetermined rotational positions with respect to the third moving barrel 16 when the third moving barrel 16 is brought into engagement with the fixed lens barrel block 12. Thus, the third moving barrel 16 needs to be firstly engaged with the cylindrical portion 12p and subsequently moved to the aforementioned engagement completion position while maintaining the aforementioned predetermined rotational positions of the plurality of engaging projections 17c, with respect to the third moving barrel 16.

Due to such a structure, in order to set the zoom lens barrel unit 100 on the fixed lens barrel block 12 at the aforementioned engagement completion position while maintaining the aforementioned predetermined rotational positions of the plurality of engaging projections 17c with respect to the third moving barrel 16, it is necessary to provide a device for allowing the plurality of engaging projections 17c to move to respective initial positions where they begin to engage with the linear guide grooves 12b, without allowing the plurality of engaging projections 17c to contact anything else until the female helicoids 12a have been brought to the aforementioned engagement completion position. In the linear guide mechanism of the present embodiment, such a device is provided on the fixed lens barrel block 12 rather than on the zoom lens barrel unit 100. Contrary to the present embodiment, if such a device is provided on the zoom lens barrel unit 100, the device needs to be constructed to allow the plurality of engaging projections 17c to further rotate about the optical axis 0 relative to the third moving barrel 16 beyond the actual rotatable range used in an actual zooming operation. Namely, in such a device it is necessary to provide a structure that allows the third moving barrel 16 and the linear guide barrel 17 to rotate relative to each other to some extent further beyond the actual rotatable range used in an actual zooming operation. That is, the device requires that the lead grooves 17b, 19c be formed sufficiently long so as to allow the third moving barrel 16 and the linear guide barrel 17 to further rotate relative to each other, which results in a longer and larger zoom lens barrel 10.

Note that in FIGS. 1 and 2 the driving pinion 15 which is accommodated in the gear housing 12c is not illustrated, and the gear train 26, which is supported on the supporting member 32, is not illustrated.

Figure 3:
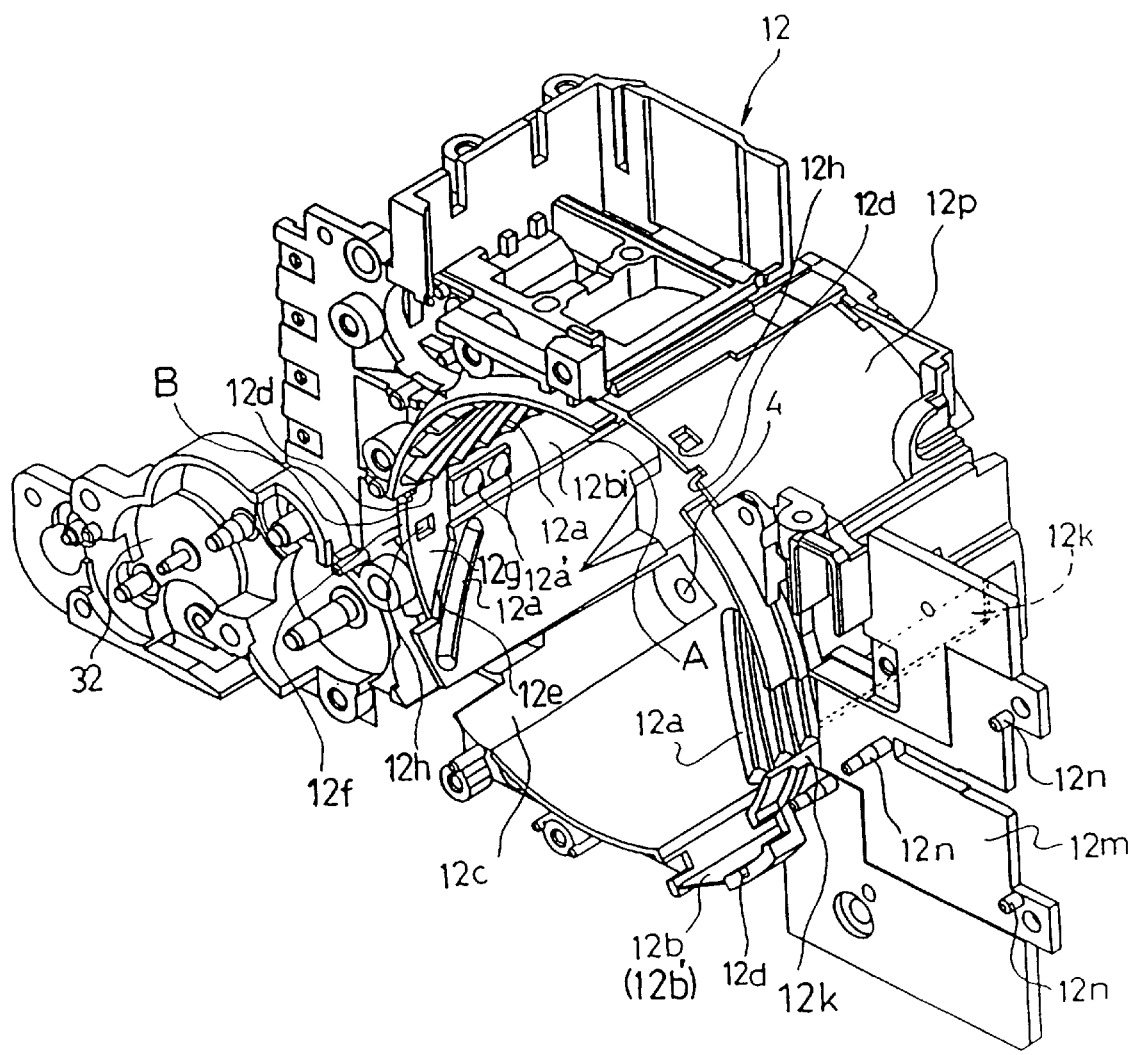
FIG. 3 is a schematic perspective view of the fixed lens barrel block shown in FIGS. 1 or 2.
Figure 4:
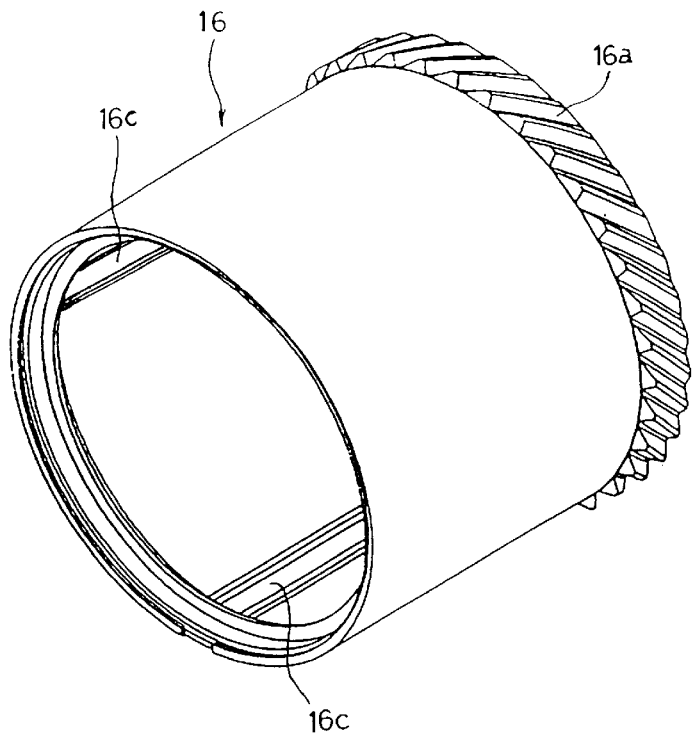
FIG. 4 is an enlarged schematic perspective view of a third moving barrel shown in FIGS. 1 or 2.
Figure 6:
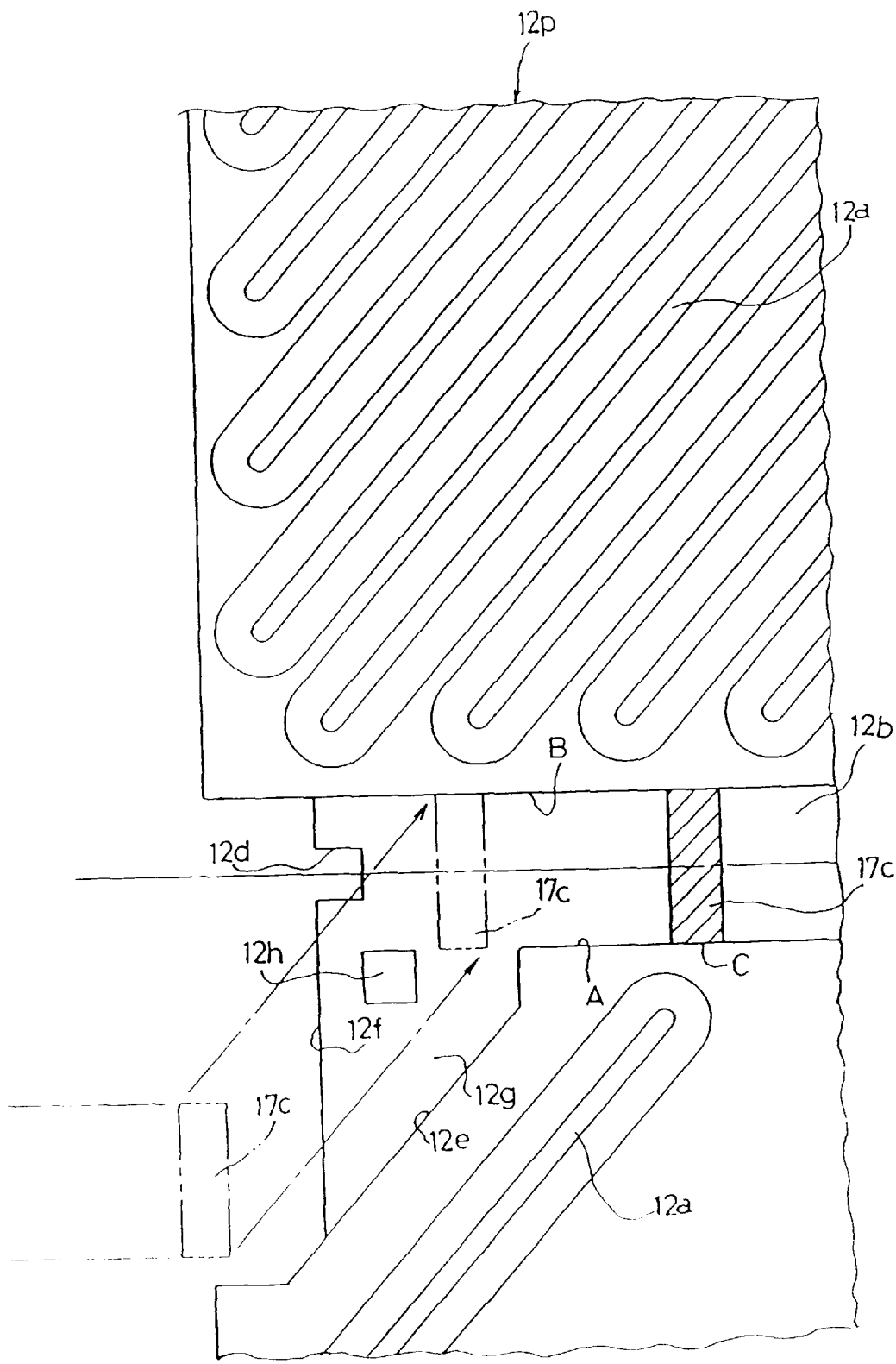
FIG. 6 is a schematic developed view of a part of the fixed lens barrel block shown in FIGS. 1, 2 or 3, illustrating a linear guide mechanism of the zoom lens barrel unit.

The aforementioned device provided on the fixed lens barrel block 12 is constructed as follows. As shown in FIGS. 1, 3 or 6, three recessed portions 12g (only one of which is shown in FIGS. 1, 3 or 6) are formed outwardly recessed in a radial direction on the inner periphery of the cylindrical portion 12p at the front end such that each recessed portion 12g connects with a corresponding one of the linear guide grooves 12b. Each recessed portion 12g includes a beveled surface or edge 12e. The beveled surface 12d is inclined in the optical axis direction and extends parallel to the female helicoid 12a. The beveled surface 12e connects with one of the side surfaces or edges "A" of the corresponding linear guide groove 12b. The other side surface "B" on the linear guide groove 12b extends in the optical axis direction. The front end of the side surface "B" extends to the front end of the cylindrical portion 12p. A front edge 12f of each recessed portion 12g is recessed by a small amount rearwardly from the front end of the cylindrical portion 12p. A cutout portion 12d is formed on the front end of the cylindrical portion 12p at each position on the front edge 12f. A rectangular hole 12h is formed in approximately the middle part of each recessed portion 12g.

The annular retaining member 33 (see, for example, FIG. 2) is secured to the front end of the cylindrical portion 12p at least after the third moving barrel 16 has been engaged with the cylindrical portion 12p with each of the engaging projections 17c engaging with the corresponding linear guide groove 12b. Namely, the annular retaining member 33 is brought into engagement with the front end of the cylindrical portion 12p after the zoom lens barrel unit 100 has been properly installed in the cylindrical portion 12p.

Figure 5:
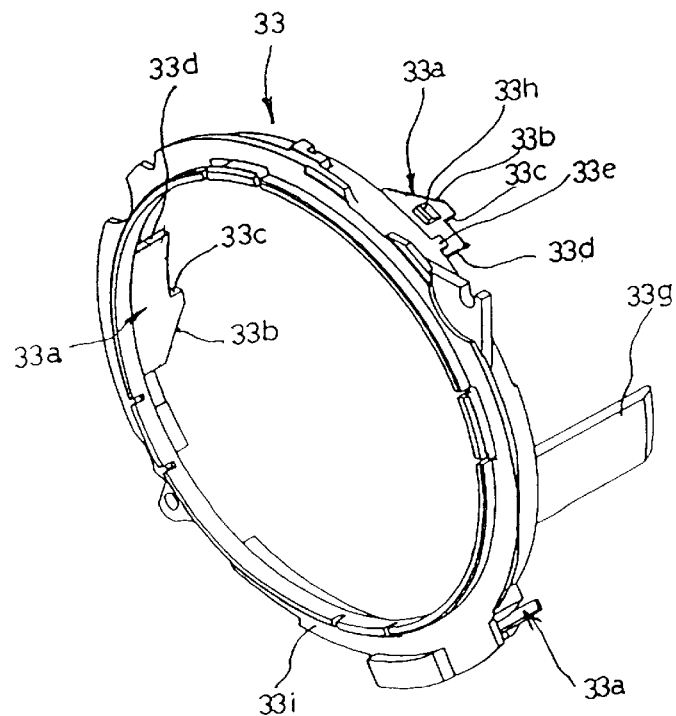
FIG. 5 is an enlarged schematic perspective view of the annular fixing member shown in FIG. 2.
Figure 7:
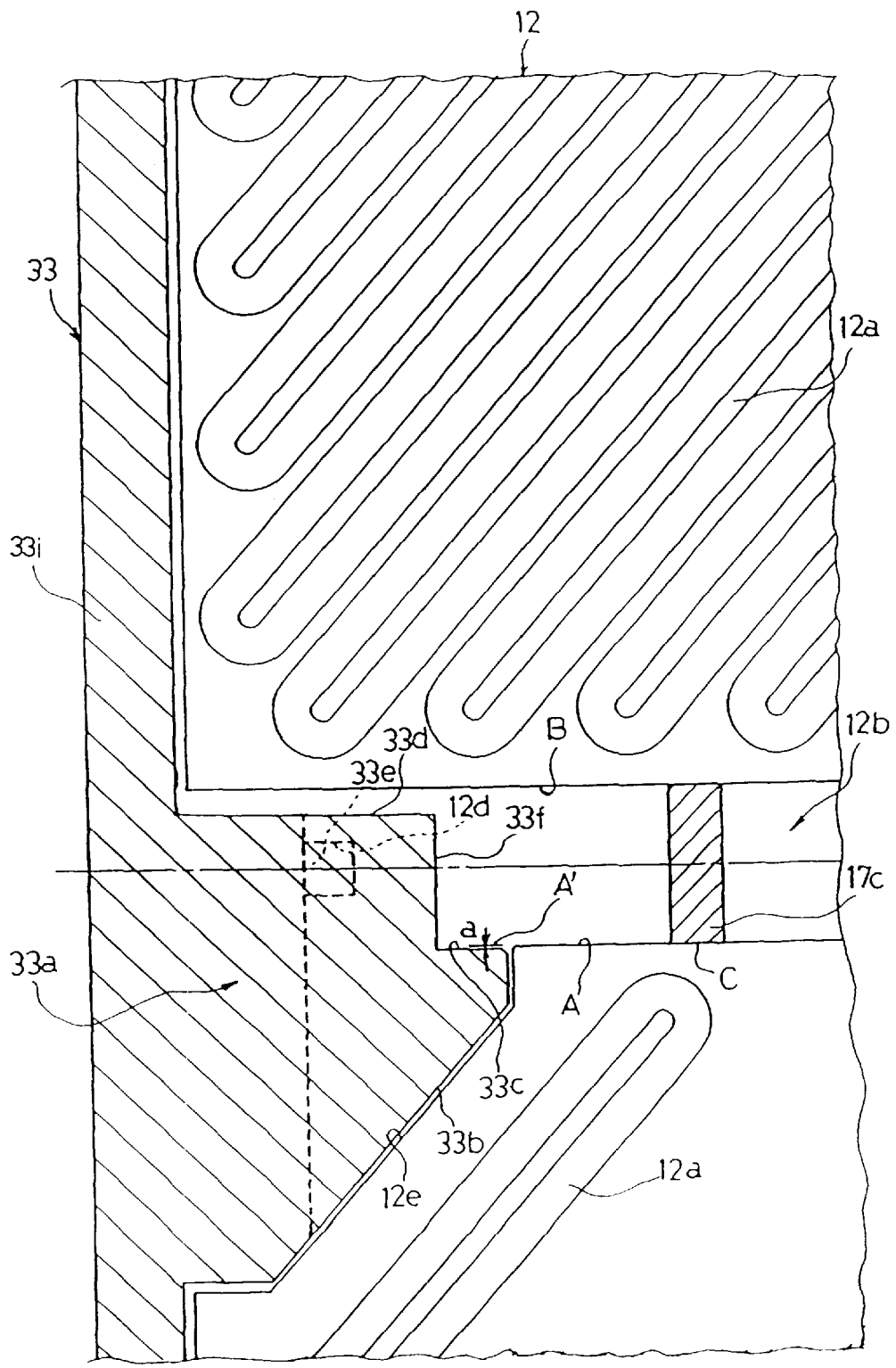
FIG. 7 is a schematic developed view of the part of the fixed lens barrel block shown in FIG. 6 and a part of the annular fixing member engaged with the fixed lens barrel block, illustrating the linear guide mechanism in a different state from that shown in FIG. 6.

As shown in FIGS. 2, 5 or 7, three engaging projections 33a, which may respectively engage with the recessed portions 12g, are integrally formed on the annular retaining member 33. The annular retaining member 33 is secured to the front end of the cylindrical portion 12p through the engaging projections 33a.

In addition to the engaging projections 33a, the annular retaining member 33 is also provided with an annular base 33i. Each of the engaging projections 33a extends rearwardly in the optical axis direction from the annular base 33i so as to correspond with the respective recessed portions 12g. The annular retaining member 33 is further provided with a strip-shaped plate 33g which is integrally formed on the annular base 33i. The plate 33g extends in the optical axis direction at the location corresponding to the position of the aforementioned cutout portion 12k. When the annular retaining member 33 properly engages with the cylindrical portion 12p, the plate 33g lies along or covers the cutout portion 12k so as to prohibit the annular retaining member 33 from rotating about the optical axis 0 relative to the cylindrical portion 12p while restricting the movement of the aforementioned intermediate part of the flexible printed circuit board 6.

Each engaging projection 33a is provided with a beveled surface 33b, a linear guide surface 33c and a parallel surface 33d. When the annular retaining member 33 properly engages with the cylindrical portion 12p, each beveled surface 33b tightly contacts the corresponding beveled surface 12e. Additionally, each linear guide surface 33c and the side surface "A" of the corresponding linear guide groove 12b are connected with each other. Thus, the linear guide surface 33c and the side surface "A" together guide a side edge "C" of the corresponding engaging projection 17c in the optical axis direction. When the annular retaining member 33 properly engages with the cylindrical portion 12p, the parallel surface 33d extends parallel to the other side surface "B" of the corresponding linear guide grooves 12b.

Each engaging projection 33a is further provided with a stop surface 33f which perpendicularly extends to both the corresponding parallel surface 33d and linear guide surface 33c to connect the parallel surface 33d with the linear guide surface 33c. When the annular retaining member 33 properly engages with the cylindrical portion 12p, each stop surface 33f defines the front end of the corresponding linear guide groove 12b as shown in FIG. 7.

Figure 8:
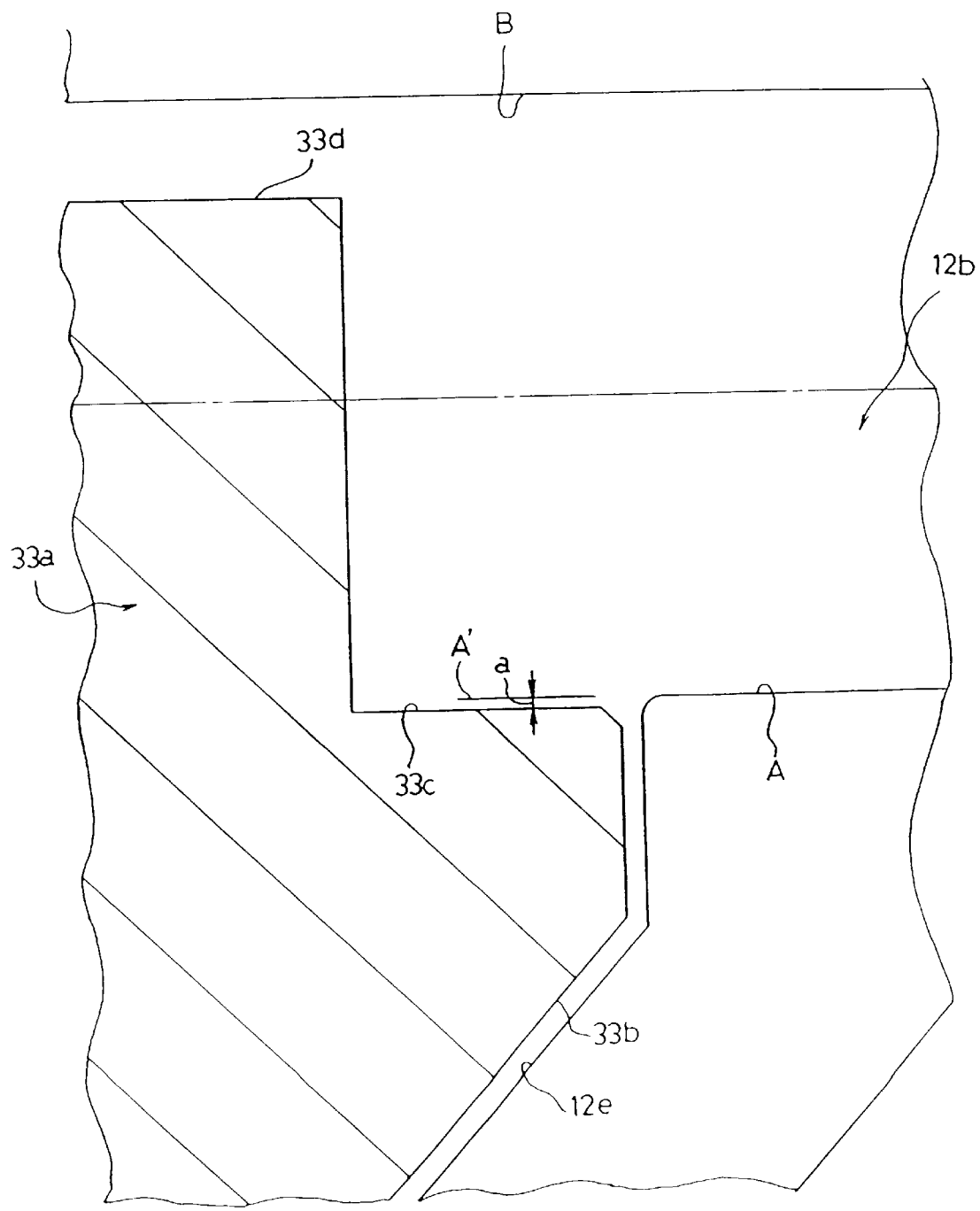
FIG. 8 is an enlarged view of a part of the view shown in FIG. 7.

Specifically, in the state when the annular retaining member 33 properly engages with the cylindrical portion 12p, each linear guide surface 33c and the side surface "A" of the corresponding linear guide groove 12b are not located in a common plane extending in the optical axis direction, but each linear guide surface 33c is slightly recessed away from the corresponding side surface "B" relative to the corresponding side surface "A" in a circumferential direction of the cylindrical portion 12p by an amount "a" as shown in FIGS. 7 or 8. In other words, the linear guide surface 33c is slightly recessed away from an imaginary surface "A'" that is located in a common plane in which the side surface "A" of the corresponding linear guide groove 12b is located. Therefore, the width of each linear guide groove 12b is slightly wider at the front end where the linear guide surface 33c is provided than the width of the remaining part of the linear guide groove 12b. The recessed linear guide surface 33c will now be discussed.

Each engaging projection 17c of the linear guide barrel 17 moves forwardly while pressing against the side surface "A" of the corresponding linear guide groover 12b when the zoom lens barrel 10 is driven to advance. For this reason, if any of the linear guide surfaces 33c are formed closer to the corresponding side surface "B than the side surface "A" of the corresponding linear guide groove 12b (i.e., beyond the corresponding imaginary surface "A'") due to an error in a molding process of the annular retaining member 33 or the like, the engaging projection 17c that engages with the linear guide groove 12b including such a linear guide surface 33c, cannot smoothly shift from the side surface "A" to the adjacent linear guide surfaces 33c. In order to prevent the occurrence of such a problem, each linear guide surface 33c is formed in such a manner as noted above, i.e., recessed by the amount "a". With this structure, if any linear guide surface 33c should be formed slightly closer to the corresponding side surface "B" due to a manufacturing error, because each linear guide surface 33c is produced to be slightly recessed away from the corresponding side surface "B", the aforementioned problem does not occur. Although each linear guide surface 33c and the side surface "A" of the corresponding linear guide groove 12b are not located in a common plane extending in the optical axis direction, a problem similar to the aforementioned problem does not occur when the zoom lens barrel 10 is driven to retract back to the camera body. This is because each engaging projection 17c of the linear guide barrel 17 moves rearwardly while pressing against the side surface "B" of the corresponding linear guide groove 12b when the zoom lens barrel 10 is driven to retract.

An engaging claw 33h is integrally formed on an outer surface of each engaging projection 33a. The engaging claws 33h respectively snap into the rectangular holes 12h when the annular retaining member 33 properly engages with the cylindrical portion 12p. An engaging projection 33e, which extends rearward from the annular base 33i in the optical axis direction, is formed on the annular retaining member 33 at a position on an outer surface of each engaging projection 33a. The engaging projections 33e respectively engage with the cutout portions 12d when the annular retaining member 33 properly engages with the cylindrical portion 12p.

According to the linear guide mechanism having the structures as noted above, the zoom lens barrel unit 100 can be installed in the cylindrical portion 12p in the following manner. After the zoom lens barrel unit 100 has been assembled, the zoom lens barrel unit 100 is placed in its most extended state. While in such a state, the rear end of the zoom lens barrel unit 100 is fitted in the front end of the inner periphery of the cylindrical portion 12p at a predetermined positional relationship. That is, the angular position of the zoom lens barrel unit 100 relative to the cylindrical portion 12p is at predetermined positional relationship when the rear end of the zoom lens barrel unit 100 engages with the front end of the inner periphery of the cylindrical portion 12p. Thereafter, the whole optical unit driving motor 25 is actuated to rotate the drive pinion 15 by several degrees in a direction to retract the third moving barrel 16 into the cylindrical portion 12p. The rotation of the whole optical unit driving motor 25 is transmitted to the third moving barrel 16 through the gear train 26, the driving pinion 15 and the outer peripheral gear 16b. Thus, the male helicoid 16a rotates relative to the female helicoid 12a to retract the third moving barrel 16 to the frontmost extremity of the actual movable range of the third moving barrel 16 during zooming. During the above-noted retraction movement of the third moving barrel 16, the linear guide barrel 17 remains located at a specific rotational position with respect to the third moving barrel 16, because the zoom lens barrel unit 100 is in its most extended state and because each engaging projection 17c passes through the corresponding recessed portion 12g to engage with the corresponding linear guide grooves 12b as shown by phantom lines in FIG. 6.

After the third moving barrel 16 has been retracted to the frontmost extremity of the actual movable range during zooming in such as manner as noted above, if the whole optical unit driving motor 25 is actuated to further rotate the drive pinion 15 in a direction to retract the third moving barrel 16 into the cylindrical portion 12p, the male helicoid 16a rotates relative to the female helicoid 12a to retract the third moving barrel 16 into the cylindrical portion 12p. At the same time, the first and second moving barrels 20, 19 retract into the second and third moving barrels 19, 16, respectively, due to the mechanical structure for driving the first, second and third moving barrels in a predetermined relationship. Consequently, the zoom lens barrel unit 100 moves into its most retracted state and is accommodated in the cylindrical portion 12p.

According to the linear guide mechanism of the present embodiment for guiding the linear guide barrel 17 along the optical axis 0 without rotating the linear guide barrel 17, the aforementioned device (which allows the engaging projections 17c to move to respective initial positions at which the engaging projections 17c start engaging with the linear guide grooves 12b, without the engaging projections 17c contacting anything until the female helicoids 12a have been brought up to the aforementioned engagement completion position) for installing or detaching the zoom lens barrel unit 100 in or from the fixed lens barrel block 12 is provided on the fixed lens barrel block 12, not on the zoom lens barrel unit 100, which advantageously results in a shorter and smaller zoom lens barrel 10. Furthermore, the recessed portions 12g are used not only for installing or detaching the zoom lens barrel unit 100 in or from the fixed lens barrel block 12, but also for forming part of the linear guide grooves 12b after the annular retaining member 33 has been secured to the front end of the cylindrical portion 12p. Accordingly, it can be understood that the recessed portions 12g are space-efficiently formed on the front part of the cylindrical portion 12p, which contributes to the realization of a small and compact zoom lens barrel 10.

The linear guide mechanism of the present embodiment will be hereinafter discussed mainly with reference to FIGS. 3 and 23–29.

Figure 23:
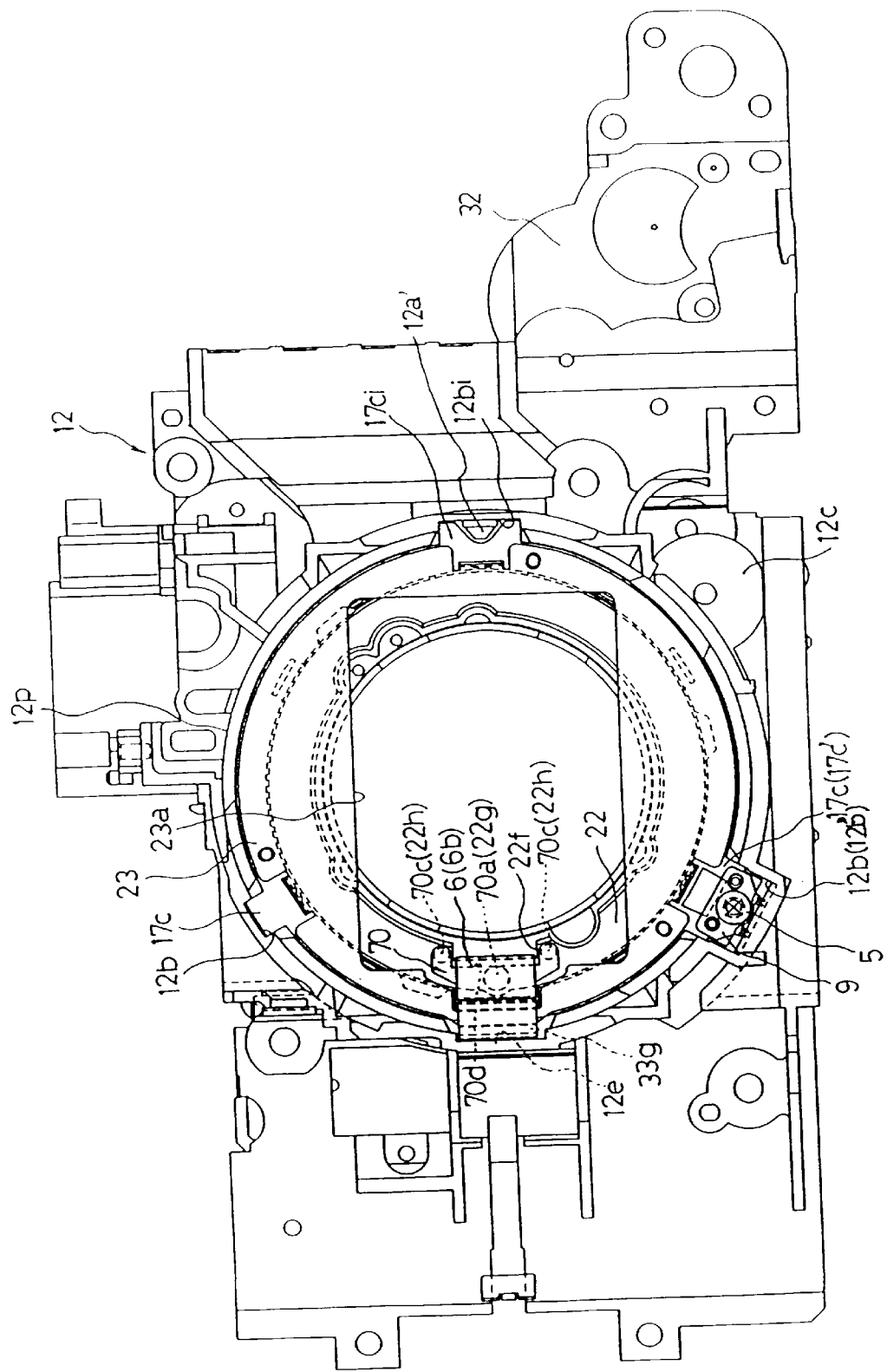
FIG. 23 is a rear elevational view of the fixed lens barrel block and some other members installed in the fixed lens barrel block, shown in FIG. 16.
Figure 24:
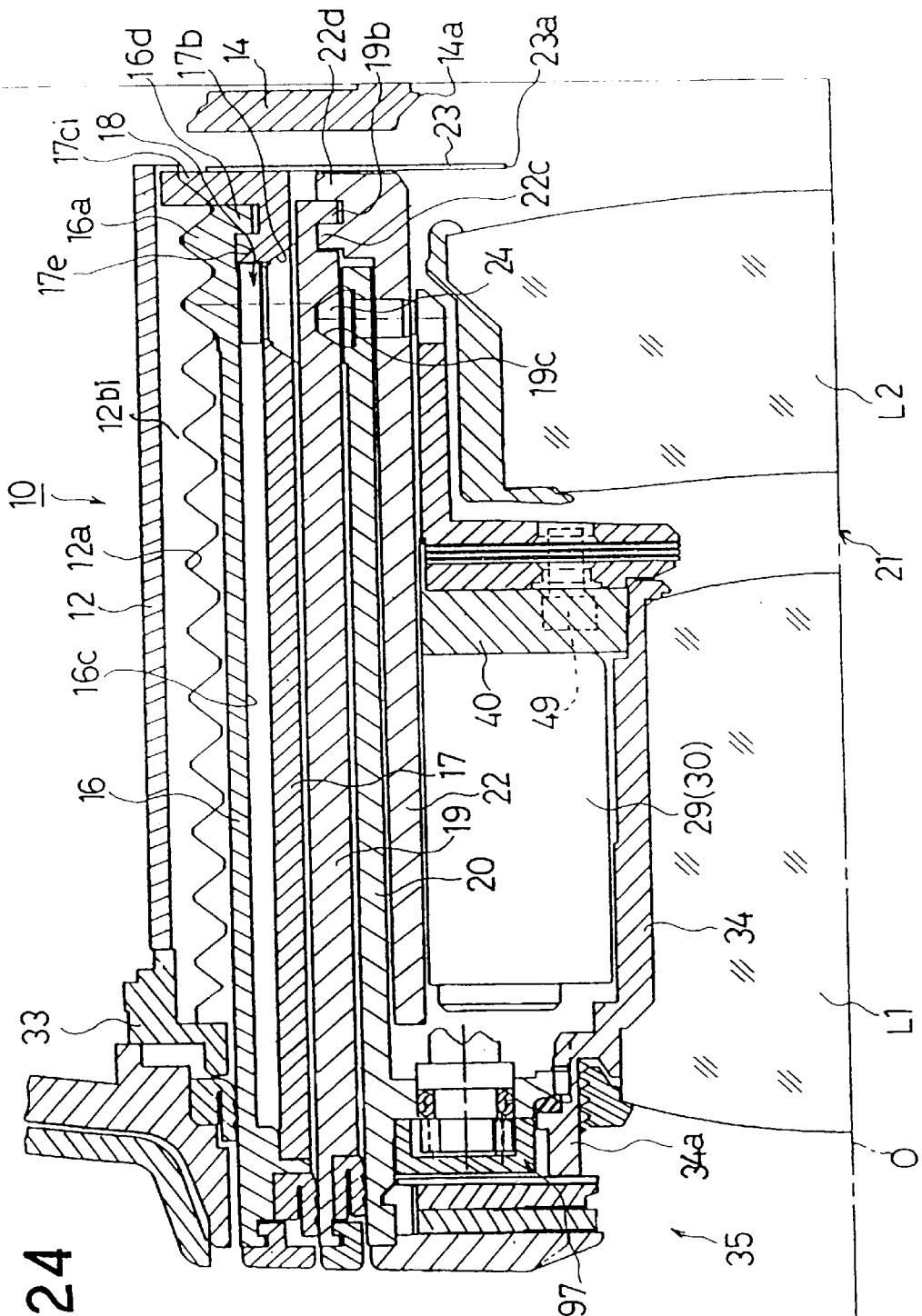
FIG. 24 is a sectional view of an upper part of the zoom lens barrel.
Figure 25:
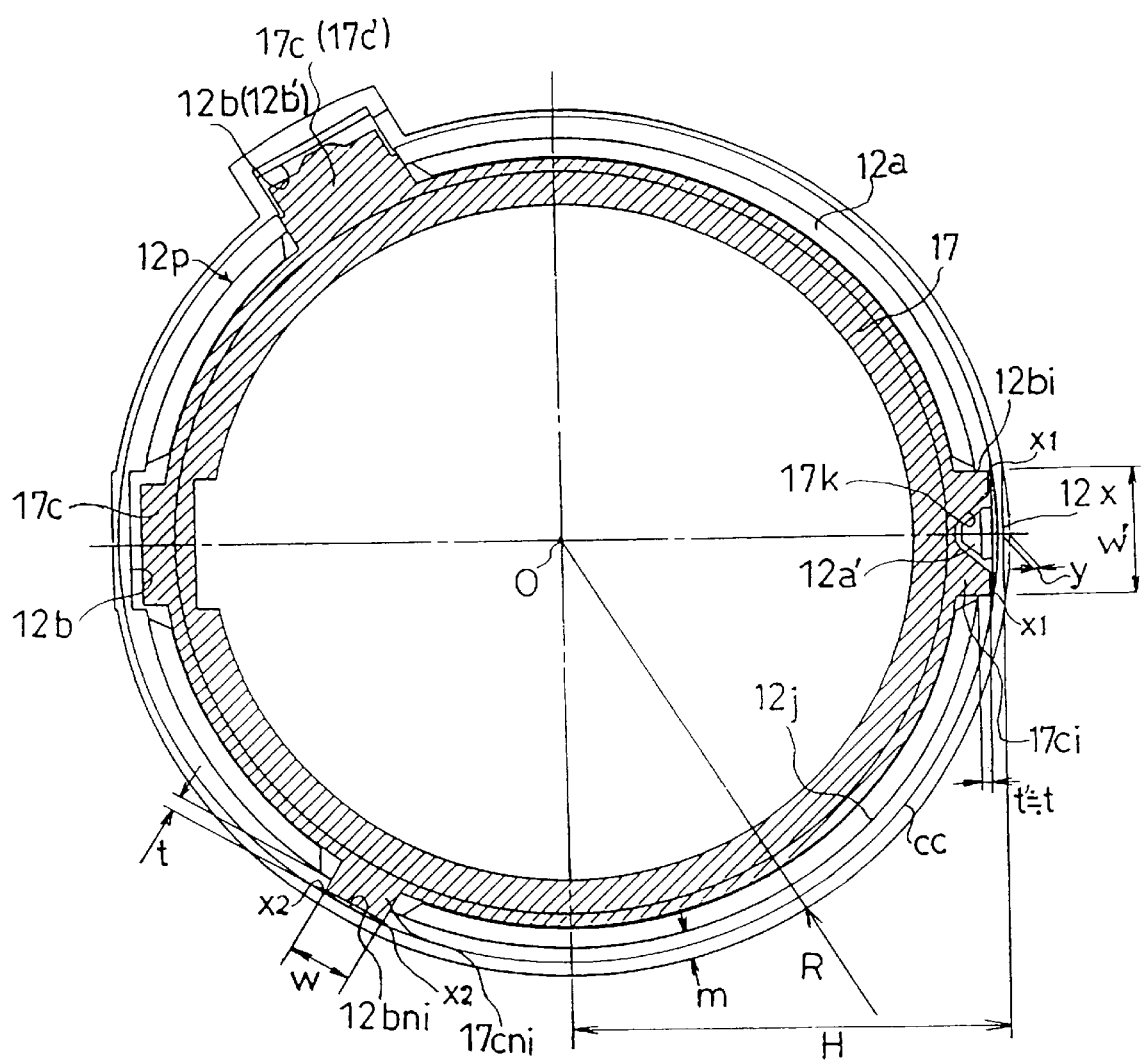
FIG. 25 is a sectional view of the fixed lens barrel block and the linear guide barrel 17, showing the state of engagement of engaging projections and linear guide grooves.
Figure 26:
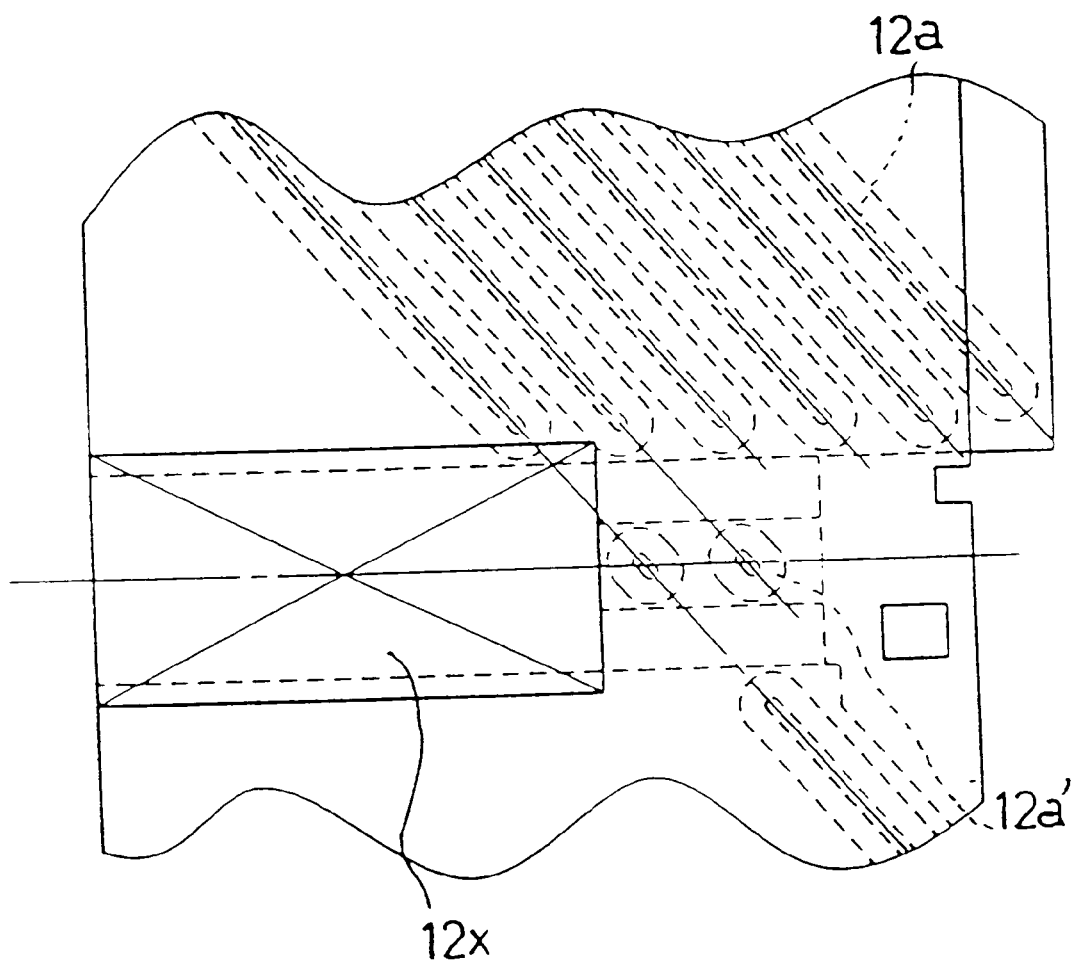
FIG. 26 is a plan view of a part of a cylindrical portion formed integral with the fixed lens barrel block.

The plurality of linear guide grooves 12b, i.e., the linear guide groove 12bi, and one of the plurality of engaging projections 17c which engages with the linear guide groove 12bi, i.e., the engaging projection 17ci, will now be discussed. As shown in FIGS. 23 or 25, the engaging projection 17ci is formed having an "M"-shaped structure so that the engaging projection 17ci does not interfere with two projections 12a' formed on a bottom of the linear guide groove 12bi. As can be seen from FIGS. 3 or 26, the two projections 12a' form part of the female helicoid 12a.

As shown in FIG. 25, another one of the plurality of linear guide grooves 12b, i.e., the linear guide groove 12bni, and another one of the plurality of engaging projections which engages with the linear guide groove 12bni, i.e., the engaging projection 17cni, are not formed having the aforementioned features of the linear guide groove 12bi and the engaging projection 17bi.

Figure 28:
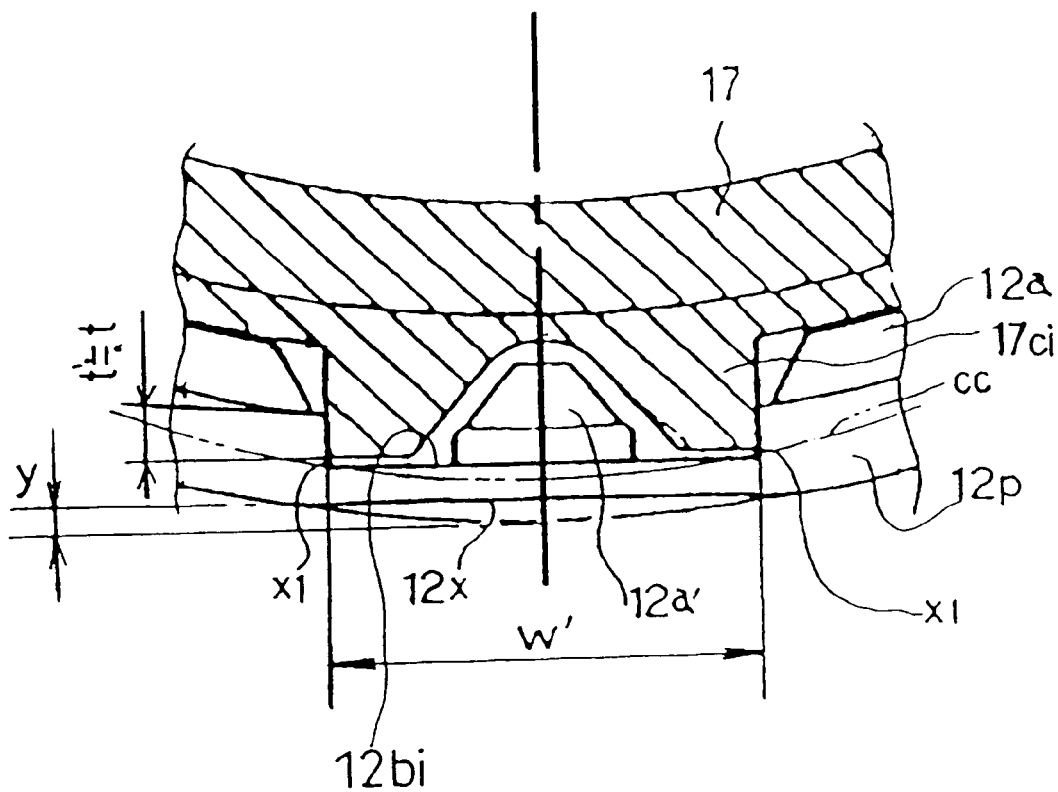
FIG. 28 is an enlarged sectional view of an engaging projection and a linear guide groove with which the engaging projection engages.

The engaging projection 17ci engages with the linear guide groove 12bi in a manner such that the engaging projection 17ci projects outwardly from the optical axis 0 by a length "t'" (amount of engagement), measured in a radial direction from the root of the female helicoid 12a to the tip of the engaging projection 17ci as shown in FIGS. 25 or 28. The tip of the engaging projection 17ci does not contact the bottom of the linear guide groove 12bi. Reference "w'" shown in FIGS. 25 or 28 represents the width of the engaging projection 17ci. Reference "x1" shown in FIGS. 25 or 28 designates a corner of the engaging projection 17ci. A line connecting "x1" with "x1" (line x1—x1) is identical to the width of the engaging projection 17ci "w'", which is substantially the same at the width of the linear guide groove 12bi.

On the other hand, the engaging projection 17cni engages with the linear guide groove 12bni in a manner such that the tip portion of the engaging projection 17cni projects into the linear guide groove 12bni by a length "t" (amount of engagement), measured in a radial direction from the root of the female helicoid 12a to the tip of the engaging projection 17cni, as shown in FIG. 25. The tip of the engaging projection 17cni does not reach the bottom of the linear guide groove 12bni. The length "t" is substantially the same as the aforementioned length "t'". The engaging projection 17cni has substantially the same mechanical strength as the engaging projection 17ci. Reference "w" shown in FIG. 25 represents the width of the engaging projection 17cni. Reference "x2" shown in FIG. 25 designates a corner of the engaging projection 17cni. A line connecting "x2" and "x2" (line x2—x2) is identical to the width of the engaging projection 17cni "w", which is substantially the same as the width of the linear guide groove 12bni. Since the lengths "t" and "t'" are substantially the same, the corners "x1", "x1" and "x2" and "x2" are substantially located on a common circle (not shown) about the optical axis 0. In other words, in FIG. 25, the three points, i.e., the corners "x1", "x1" and the optical axis 0 form an isosceles triangle, and another three points, i.e., the corners "x2", "x2" and the optical axis 0 forms another isosceles triangle. The bases of the two isosceles triangles each touch a common imaginary circle cc about the optical axis 0. Due to this arrangement, the bottom surface of each of the linear guide grooves 12bi, 12bni extends in a plane perpendicular to a radial direction of the cylindrical portion 12p. Another common imaginary circle (not shown) about the optical axis 0, with which corners on the bottom of each linear guide groove 12b come in contact, is formed which is slightly larger than the common imaginary circle cc because the tip of each engaging projection nearly contacts the bottom of the corresponding linear guide groove 12b.

The aforementioned linear guide mechanism is part of the outer peripheral surface of the cylindrical portion 12p which is located at the position opposite to the bottom of the linear guide groove 12*bi*, and can be formed as a flat surface extending parallel to the bottom surface of the linear guide groove 12*bi*. This structure will be discussed hereinafter.

As previously noted, the linear guide barrel 17 does not rotate with respect to the fixed lens barrel block 12. However, since the third moving barrel 16 rotates relative to the linear guide barrel 17, the rotational force of the third moving barrel 16 is transmitted from the male helicoid 16*a* to the female helicoid 12*a*. As a result of this rotation, the linear guide barrel 17 moves linearly along the optical axis 0 while receiving the rotational force at the engaging projections 17*c* through the linear guide grooves 12*b*. Therefore, if the aforementioned amount of engagement "t" or "t'" of each engaging projection 17*c* is too short and/or the width "w" or "w'" of each linear guide groove 12*b* is too narrow, the engaging projections 17*c* may disengage from the respective linear guide grooves 12*b* when the linear guide barrel 17 moves linearly along the optical axis 0. However, such a problem does not occur if the amount of engagement "t" or "t'" of each engaging projection 17*c* and the width "w" or "w'" of each linear guide groove 12*b* are designed sufficiently large.

Figure 27:
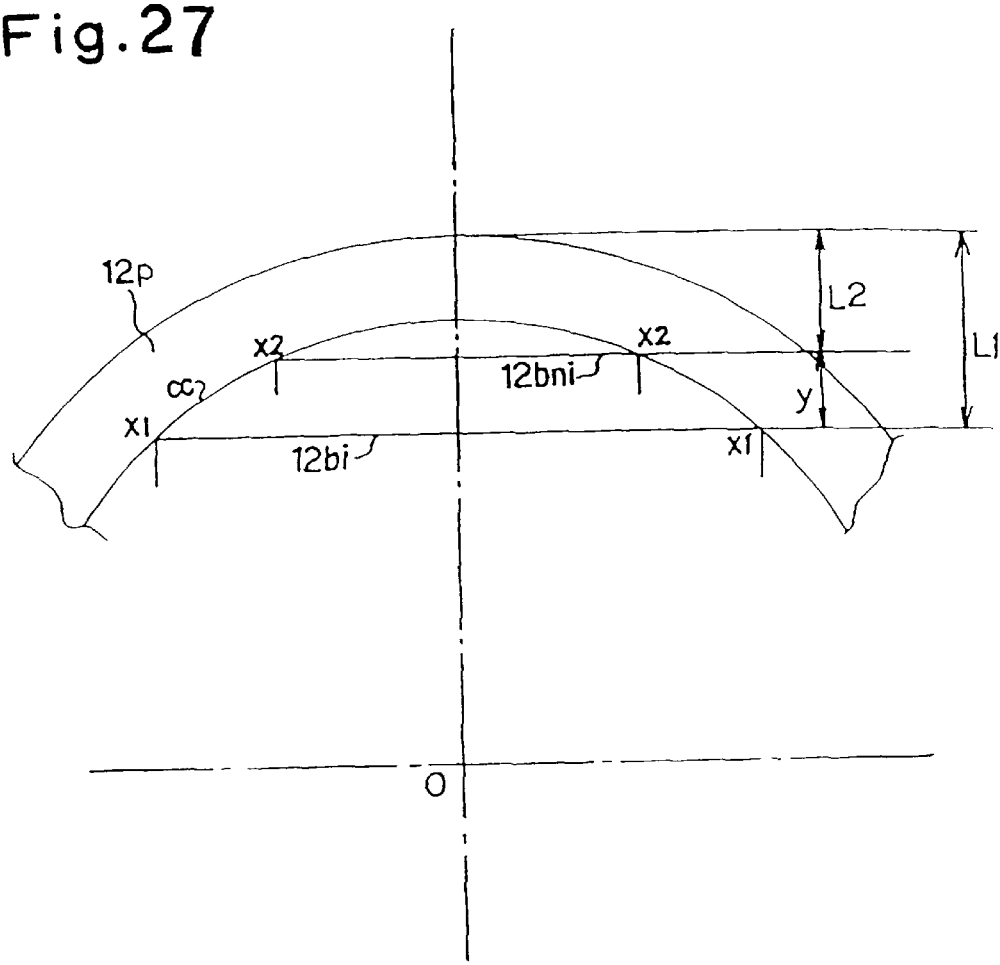
FIG. 27 is a diagram illustrating the difference in thickness of the cylindrical portion between a part of the cylindrical portion where one linear guide groove is formed and another part of the cylindrical portion where another guide groove, having a wider width, is formed.

As can be understood from FIG. 27, the larger the width of the linear guide groove 12*bi* (the length of the line x1—x1), the closer each corner point x1 is with respect to the optical axis 0. That is, the wider the width of the linear guide groove 12*bi*, the closer the line x1—x1 is to the optical axis 0 with respect to the line x2—x2. For this reason, the thickness of the cylindrical portion 12*p*, at the portion where the linear guide groove 12*bi* is formed, will become thicker than that at the portion where the linear guide groove 12*bni* is formed when the bottom of the linear guide groove 12*bi* is formed so as to nearly contact the tip of the engaging projection 17*ci* as noted above. In such a case, the thickness of the cylindrical portion 12*p* at the portion where the linear guide groove 12*bi* is formed will be thicker than that at the portion where the linear guide groove 12*bni* is formed by a thickness "y" as shown in FIG. 27. References "L1" and "L1" respresent the length from the bottom of the linear guide groove 12*bi* to the outer periphery of the cylindrical portion 12*p*, and the length from the bottom of the linear guide groove 12*bni* to the outer periphery of the cylindrical portion 12*p*, respectively. The thickness "y" is equal to the difference between lengths "L1" and "L2" (L1−L2=y).

In the present embodiment, as illustrated in FIG. 28, the portion of the cylindrical portion 12*p* which forms the bottom of the linear guide groove 12*bi* is formed to have the same thickness as the portion of the cylindrical portion 12*p* where the linear guide groove 12*bni* is formed, by cutting off part of an outer layer of the cylindrical portion 12*p* by an amount corresponding to the thickness "y". By so doing, the portion of the outer peripheral surface of the cylindrical portion 12*p*, which is located at the position opposite to the bottom of the linear guide groove 12*bi*, is formed to be a flat surface 12*x* extending parallel to the bottom surface of the linear guide groove 12*bi*.

Figure 29:
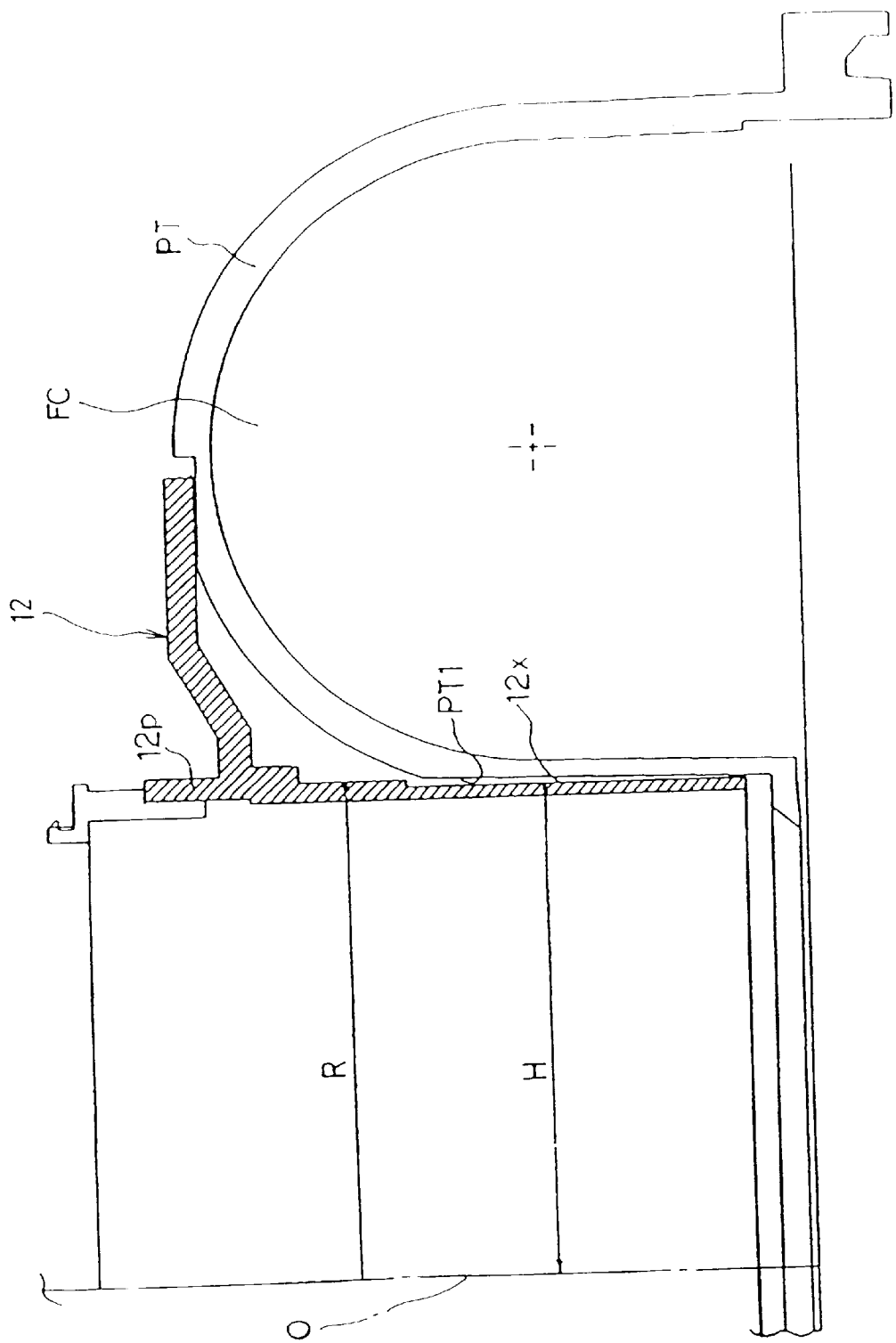
FIG. 29 is a sectional view of the fixed lens barrel block and a wall forming a film chamber of the zoom lens camera.

The flat surface 12*x* is located immediately next to a flat surface PT1 of a wall PT forming a film chamber FC of the zoom lens camera of the present embodiment. The wall PT is secured to the fixed lens barrel block 12, and the flat surface PT1 extends parallel to the flat surface 12*x*. Since the flat surface 12*x* is formed by cutting off a portion of an outer layer of the cylindrical portion 12*p* in such a manner as noted above, the film chamber FC is successfully located closer to the cylindrical portion 12*p* towards the optical axis 0, by the amount corresponding to the aforementioned thickness "y", which contributes to the minimization of the size of the zoom lens camera of the present embodiment, particularly in the width of the camera. This structure effectively minimizes the width of the zoom lens camera as can be appreciated by comparing a distance "H" from the optical axis 0 to the flat surface 12*x* with a distance "R" from the optical axis 0 to an outer peripheral surface of the cylindrical portion 12*p* (on which the flat surface 12*x* is not formed) as shown in FIG. 29. The distances "H" and "R" are also illustrated in FIG. 25. The front and rear of the zoom lens camera of the present embodiment respectively correspond to the up and down as viewed in FIG. 29.

In the zoom lens camera of the present embodiment, the linear guide mechanism is adopted to the linear guide groove 12*bi* and the engaging projection 17*ci*. However, such a linear guide mechanism may be applied to another linear guiding groove and engaging projection which engage with each other.

In the above-described embodiment of the zoom lens barrel 10, although the zoom lens optical system consists of two movable lens groups, i.e., the front lens group L1 and the rear lens group L2, it should be understood that the present invention is not limited to the present embodiment disclosed above, and that the present invention may also be applied to another type of zoom lens optical system which includes one or more fixed lens groups.

In addition, in the above embodiment, the rear lens group L1 is provided as a component of the AF/AE shutter unit 21, and the AE motor 29 and the rear lens group driving motor 30 are mounted to the AF/AE shutter unit 21. With such a structure, the structure for supporting the front and rear lens groups L1 and L2 and the structure for driving the rear lens group L2 are both simplified. Instead of adopting such a structure, the zoom lens barrel 10 may also be realized in such a manner by making the rear lens group L2 a member separate from the AF/AE shutter unit 21, which is provided with the shutter mounting stage 40, the circular driving member 49, the supporting member 47, the shutter blades 27, the shutter blade supporting ring 46 and the like, and that the rear lens group L2 is supported by a supporting member other than the AF/AE shutter unit 21.

In the zoom lens camera of the present embodiment, the operation by rotation of the whole optical unit driving motor 25 and the rear lens group driving motor 30 will now be described with reference to FIGS. 17, 18, 19 and 20.

As shown in FIGS. 18 or 20, when the zoom lens barrel 10 is at the most retracted (withdrawn) position, i.e., the lens-housed condition, when the power switch is turned ON, the whole optical unit driving motor 25 is driven to rotate its drive shaft in the forward rotational direction by a small amount. This rotation of the motor 25 is transmitted to the driving pinion 15 through a gear train 26, which is supported by a supporting member 32 integrally formed with the fixed lens barrel block 12, to rotate the third moving barrel 16 in one predetermined rotational direction to advance forwardly along the optical axis 0. Therefore, the second moving barrel 19 and the first moving barrel 20 are each advanced by a small amount in the optical axis direction, along with the third moving barrel 16. Consequently, the camera is in a state capable of photographing with the zoom lens positioned at the widest position, i.e., the wide end. At this stage, because the amount of movement of the linear guide barrel 17 with respect to the fixed lens barrel block 12 is detected through the relative slide between the code plate 13*a* and the contacting terminal 9, the focal length of the zoom lens barrel 10, i.e., the front and rear lens groups L1 and L2, is detected.

In the photographable state as above described, when the aforementioned zoom operating lever is manually moved towards a "tele" side, or the "tele" zoom button is manually depressed to be turned ON, the whole optical unit driving motor 25 is driven to rotate its drive shaft in the forward rotational direction through the whole optical unit driving motor controller 60 so that the third moving barrel 16 rotates in the rotational direction to advance along the optical axis 0 via the driving pinion 15 and the outer peripheral gear 16b. Therefore, the third moving barrel 16 is advanced from the fixed lens barrel block 12 according to the relationship between the female helicoid 12a and the male helicoid 16a. The linear guide barrel 17 moves forwardly in the optical axis direction together with the third moving barrel 16, without relative rotation to the fixed lens barrel block 12, according to the relationship between the engaging projections 17c and the linear guide grooves 12b. At this time, the simultaneous engagement of the follower pins 18 with the respective lead slots 17b and linear guide grooves 16c causes the second moving barrel 19 to move forwardly relative to the third moving barrel 16 in the optical axis direction, while rotating together with the third moving barrel 16 in the same rotational direction relative to the fixed lens barrel block 12. The first moving barrel 20 moves forwardly from the second moving barrel 19 in the optical axis direction, together with the AF/AE shutter unit 21, without relative rotation to the fixed lens barrel block 12, due to the above-noted structures in which the first moving barrel 20 is guided linearly by the linear guide member 22 and in which the follower pins 24 are guided by the lead grooves 19c. During such movements, because the moving position of the linear guide barrel 17 with respect to the fixed lens barrel block 12 is detected through the relative slide between the code plate 13a and the contacting terminal 9, the focal length set by the zoom operation device 62 is detected.

Conversely, when the zoom operating lever is manually moved towards a "wide" side, or the "wide" zoom button is manually depressed to be turned ON, the whole optical unit driving motor 25 is driven to rotate its drive shaft in the reverse rotational direction through the whole optical unit driving motor controller 60 so that the third moving barrel 16 rotates in the rotational direction to retract into the fixed lens barrel block 12 together with the linear guide barrel 17. At the same time, the second moving barrel 19 is retracted into the third moving barrel 16, while rotating in the same direction as that of the third moving barrel 16, and the first moving barrel 20 is retracted into the rotating second moving barrel 19 together with the AF/AE shutter unit 21. During the above retraction driving, as in the case of advancing driving as above described, the rear lens group driving motor 30 is not driven.

Figure 17:
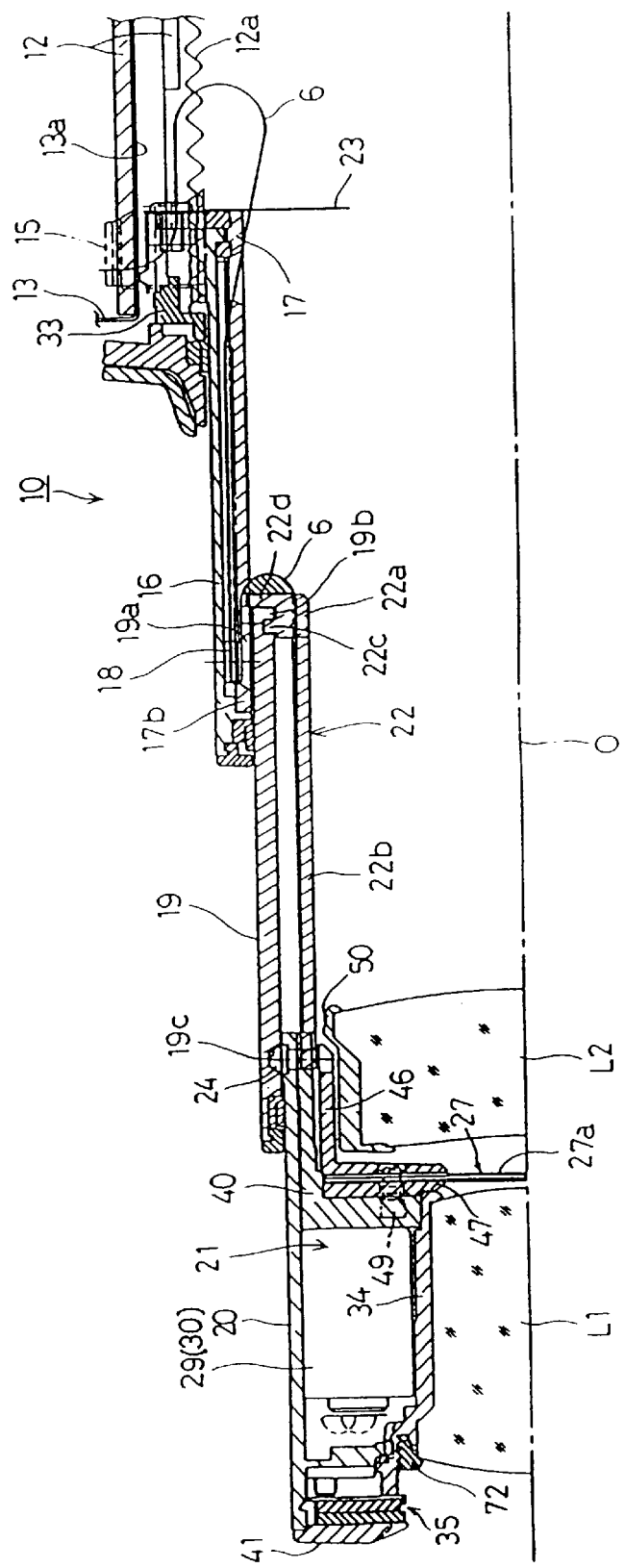
FIG. 17 is a sectional view of an upper part of the zoom lens barrel in a maximum extended state.
Figure 19:
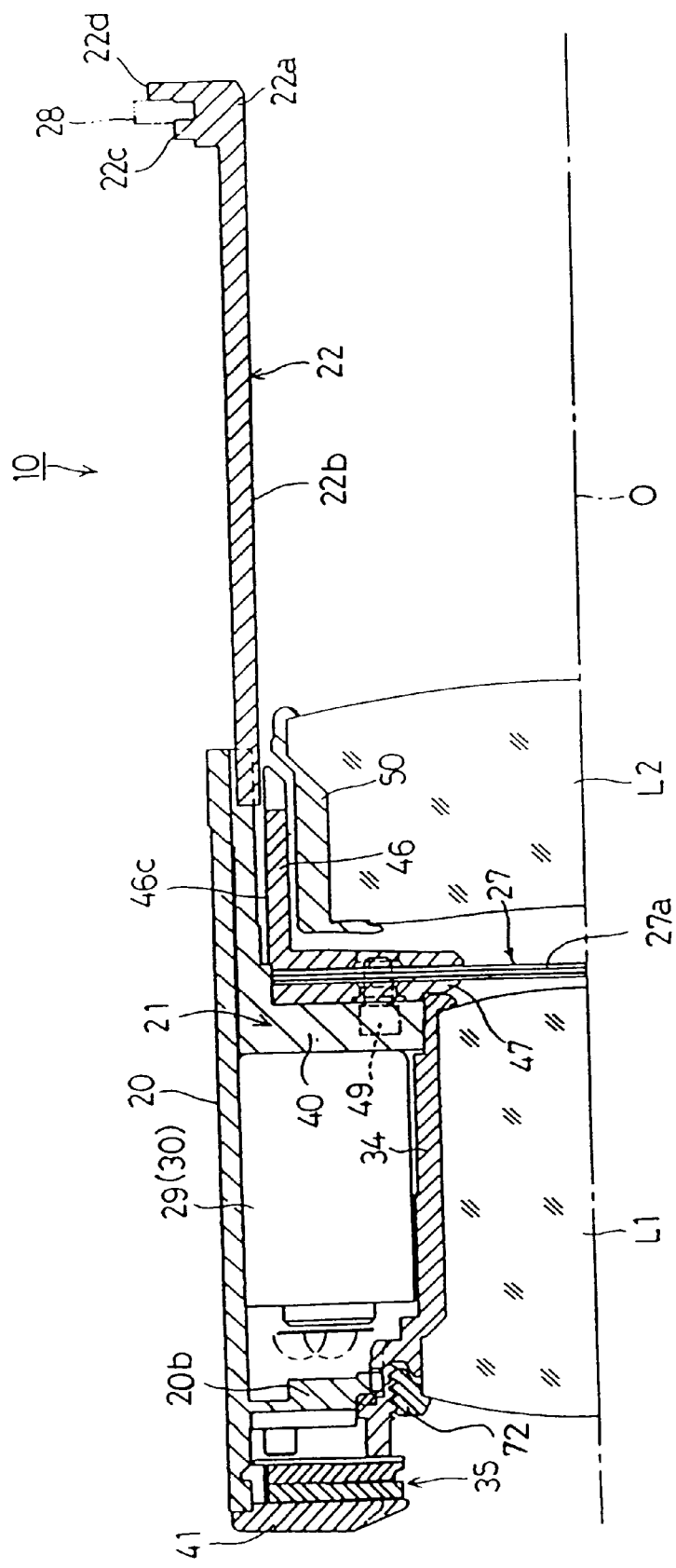
FIG. 19 is a sectional view of the upper part of the zoom lens barrel shown in FIG. 18 in the maximum extended state.

While the zoom lens barrel 10 is driven during the zooming operation, since the rear lens group driving motor 30 is not driven, the front lens group L1 and the rear lens group L2 move as a whole, maintaining a constant distance between each other, as shown in FIGS. 17 or 19. The focal length input via the zoom code plate 13a and the contacting terminal 9 is indicated on an LCD panel (not shown) provided on the camera body.

At any focal length set by the zoom operating device 62, when the release button is depressed by a half-step, the object distance measuring apparatus 64 is actuated to measure a current subject distance. At the same time the photometering apparatus 65 is actuated to measure a current subject brightness. Thereafter, when the release button is fully depressed, the whole optical unit driving motor 25 and the rear lens group driving motor 30 are each driven by respective amounts dictated according to the focal length information set in advance and the subject distance information obtained from the object distance measuring apparatus 64 so that the front and rear lens groups L1 and L2 are respectively moved to specified positions to obtain a specified focal length to bring the subject into focus. Immediately after the subject is brought into focus, the AE motor 29 is driven via the AE motor controller 66 to rotate the circular driving member 49 by an amount corresponding to the subject brightness information (obtained from the photometering apparatus 65) so that the shutter 27 is driven to open the shutter blades 27a by a specified amount which satisfies the required exposure. Immediately after such a shutter release operation, i.e., where the three shutter blades 27a are opened and subsequently closed is completed, the whole optical unit driving motor 25 and the rear lens group driving motor 30 are both driven to move the front lens group L1 and the rear lens group L2 to the respective initial positions which they were at prior to a shutter release.

In the present embodiment of the zoom lens barrel 10, "Fantas Coat SF-6" is used as the coating 72e. However, a different type of coating may be used as the coating 72e as long as it is waterproof and makes the circular abutting surface 72b a smooth surface to form substantially no gap between the circular abutting surface 72b and the circumferential portion fp.

Obvious changes may be made in the specific embodiments of the present invention described herein, such modifications being within the spirit and scope of the invention claimed. It is indicated that all matter contained herein is illustrative and does not limit the scope of the present invention.

What is claimed is:

1. A lens barrel comprising:
   a barrel provided on an inner periphery thereof with a linear guide groove extending in a direction of an optical axis of said lens barrel; and
   an annular member arranged concentrically with said barrel, said annular member being provided with a follower which engages with said linear guide groove so that said annular member is guided along said optical axis without rotating about said optical axis relative to said barrel,
   wherein a part of an outer periphery of said barrel which is located adjacent to said linear guide groove is formed as a plane surface, and further wherein a distance between said plane surface and said optical axis is shorter than a distance between said optical axis and a part of said outer periphery of said barrel which is not formed as said plane surface.

2. The lens barrel according to claim 1, wherein a bottom of said linear guide groove is formed as a plane bottom surface extending in said direction of said optical axis and perpendicular to a radial direction of said barrel, said plane surface being formed parallel to said plane bottom surface.

3. The lens barrel according to claim 2, further comprising:
   a first thread formed on said inner periphery of said barrel so that said linear guide groove extends within said first thread;
   a rotational barrel positioned inside said barrel and provided with a second thread which meshes with said first thread so that said rotational barrel is movable along said optical axis while rotating about said optical axis relative to said barrel; and at least one projection formed at a bottom of said linear guide groove, said at least one projection engaging with said second thread so as to function as a part of said first thread.

4. The lens barrel according to claim 3, wherein said follower and said linear guide groove are each formed to have a width greater than a predetermined minimum width and a height equal to a predetermined minimum height.

5. The lens barrel according to claim 3, wherein said at least one projection is formed substantially in a middle of said linear guide groove in a circumferential direction of said barrel.

6. A lens barrel comprising:

a barrel provided on an inner periphery thereof with a plurality of linear guide grooves each extending in a direction of an optical axis of said lens barrel; and an annular member arranged concentrically with said barrel, said annular member being provided with a plurality of followers which respectively engage with said plurality of linear guide grooves so that said annular member is guided along said optical axis without rotating about said optical axis relative to said barrel, wherein a part of said barrel where one of said plurality of linear guide grooves is formed has a thickness thinner than any other parts of said barrel where the rest of said plurality of linear guide grooves are formed.

* * * * *